(12) United States Patent
Toshio et al.

(10) Patent No.: US 6,617,193 B1
(45) Date of Patent: Sep. 9, 2003

(54) SEMICONDUCTOR DEVICE, SEMICONDUCTOR DEVICE SUBSTRATE, AND METHODS OF FABRICATING THE SAME

(75) Inventors: Yamazaki Toshio, Ogo-ri (JP); Fukutomi Naoki, Tokyo (JP); Suzuki Kazuhisa, Nagareyama (JP); Morita Hiroshi, Fujisawa (JP); Wakashima Yoshiaki, Kawasaki (JP); Naoyuki Susumu, Yuki (JP); Kida Akinari, Shimotsuga (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/680,328

(22) Filed: Oct. 5, 2000

Related U.S. Application Data

(63) Continuation-in-part of application No. 09/423,062, filed as application No. PCT/JP98/01970 on Apr. 30, 1998, now Pat. No. 6,268,648.

(30) Foreign Application Priority Data

| Apr. 30, 1997 | (JP) | 9-112753 |
| Feb. 6, 1998 | (JP) | 10-25896 |
| Oct. 7, 1999 | (JP) | 11-287361 |

(51) Int. Cl.[7] ............................................. H01L 21/44
(52) U.S. Cl. ................... 438/106; 438/118; 438/123; 257/678; 257/780
(58) Field of Search ................... 438/106, 118, 438/123; 257/678, 780

(56) References Cited

U.S. PATENT DOCUMENTS 5,656,550 A * 8/1997 Tsuji et al. ................ 438/123
6,268,648 B1 * 7/2001 Fukutomi et al. .......... 257/678
6,316,290 B1 * 11/2001 Wensel ....................... 438/118
6,333,564 B1 * 12/2001 Katoh et al. ................ 257/780

FOREIGN PATENT DOCUMENTS

| JP | 50-147292 | 11/1975 | |
| JP | 50-147292 A | 11/1975 | ........... H01L/27/02 |
| JP | 63-198186 A | 8/1988 | ........... G06M/7/00 |
| JP | U 2-095246 | 7/1990 | ........... H01L/23/02 |
| JP | U 2-142540 | 12/1990 | ........... H01L/23/12 |
| JP | 3-163861 A | 7/1991 | ........... H01L/25/00 |
| JP | 3-177055 | 8/1991 | |
| JP | 3-177055 A | 8/1991 | ........... H01L/23/12 |
| JP | 4-340750 A | 11/1992 | ........... H01L/23/12 |
| JP | 6-244304 | 9/1994 | |
| JP | 6-244304 A | 9/1994 | ........... H01L/23/12 |
| JP | 7-094628 A | 4/1995 | ........... H01L/23/12 |
| JP | 10-303329 | 11/1998 | |
| WO | WO 98/49726 | 11/1998 | |

\* cited by examiner

Primary Examiner—Michael S. Lebentritt
Assistant Examiner—Pho Luu
(74) Attorney, Agent, or Firm—Pennie & Edmonds LLP

(57) ABSTRACT

A semiconductor device comprising a substrate with a cavity portion for mounting a semiconductor chip is provided to achieve a high reliability and to decrease a size and a fabricating cost. The cavity portion for mounting the semiconductor chip at the center portion of the substrate is formed by press forming with a projected portion of a die while adhering a press shapeable wiring body comprising a copper wiring which becomes wiring material, a barrier layer such as nickel alloy or the like, and a copper foil which is a carrier layer, to a resin substrate, so as to have wiring buried into a surface of the substrate and to form a ramp between an inner connection terminal portion connecting to the semiconductor chip and an external connection terminal portion connecting to an external connection terminals, the internal and external connection terminal portions being two end portions of the wiring.

3 Claims, 15 Drawing Sheets

SEMICONDUCTOR DEVICE, SEMICONDUCTOR DEVICE SUBSTRATE, AND METHODS OF FABRICATING THE SAME

This application is a Continuation-In-Parts of application Ser. No. 09/423,062, filed on Oct. 29, 1999, now U.S. Pat. No. 6,268,648 which is a 371 of PCT/JP98/01970 filed Apr. 30, 1998, the contents of which are incorporated herein by reference in their entirety. This application is based on Japanese Patent Applications No. 10-546833 and No. 11-287361 filed in Japan, the contents of which are incorporated herein by reference.

BACKGROUND OF THE INVENTION

1. Field of the Invention

This invention is related to a substrate for mounting semiconductor elements (called semiconductor device substrate hereafter), a semiconductor device in which the semiconductor elements are mounted on the semiconductor device substrate and methods of fabricating them.

2. Related Art

There is growing needs for a smaller semiconductor device package with multiple terminal pins due to increases of an integration rate and an operation frequency in the recent semiconductor device. However, a package size of a conventional peripheral terminal type utilizing a leadframe has to be made larger if a number of the terminals should be increased further. One of countermeasures is to decrease a terminal pitch in the package. However, it is difficult to make the terminal pitch narrower than 0.4 mm.

To accommodate such increasing number of the terminals, an area array type package with its terminals disposing over a surface plane is introduced. The area array type package requires to have a wiring substrate for providing wiring from a pad of semiconductor chips to external connection terminals. The semiconductor chip may be mounted either at the upper surface or the lower surface of the wiring substrate when the external connection terminals are disposed at the lower surface of the wiring substrate. When the semiconductor chip is mounted on the upper surface of the wiring substrate, interlayer connections between the upper surface and the lower surface of the wiring substrate have to be provided. When the semiconductor chip is mounted on the lower surface of the wiring substrate, the interlayer connections will not be required. However, a hollow space has to be provided to absorb total thickness of the semiconductor chip and its sealing material when the semiconductor chip is mounted on the lower surface of the wiring substrate.

The hollow space is called a cavity, and a structure with the cavity at the lower surface of the wiring substrate is called a cavity down structure. Typically, the structure can be made by hollowing out a semiconductor chip substrate, or by making a hole through the semiconductor device substrate and adhering a base plate thereto. Wiring for a multiple layer structure is required when heights of semiconductor chip bonding portions and external connection terminals are changed because the wiring is also disposed on the same surface in this structure. That is, a wiring structure body in consideration of a three dimensional spatial relationships among the semiconductor chip mount portion, the inner bonding portion connected to mounted semiconductor chips and the external connection terminal portion in which external connection terminals are formed.

One of the area array type semiconductor package is Ball Grid Array (BGA) in which solder balls are used as external connection terminals. Cost of the BGA is higher than that of a semiconductor device fabricated with a conventional leadframe, and reduction of the cost is anticipated. The higher cost is due to a fact that a structure and fabricating process of the semiconductor device substrate are more complex than that of a substrate with the leadframe. Accordingly, it is anticipated the development of simpler structure and fabricating process of the semiconductor device substrate.

The wiring substrate used for the area array type semiconductor package is typically called an interposer. The interposer may be roughly classified into a film type and a rigid plate type. A number of the wiring layers can be either one, or two, or three and more layers. Generally, the fabricating cost is lower for a fewer number of the wiring layers.

In the interposer so called TAB (Tape Automated Bonding) or TCP (Tape Carrier Package) and their packaging technology, the center portion of the interposer is bored through to store the semiconductor chip. With the rigid plate, the center portion of the interposer is similarly bored through to hollow the semiconductor chip store portion out and adhere a metal plate as a base plate thereto, or the cavity portion is fabricated at the center area of the interposer. The wiring is disposed only in a flat plane portion, not inside the cavity portion.

SUMMARY OF THE INVENTION

Among those conventional technologies, the lowest cost is expected with the single layer wiring structure. If the wiring is disposed at least in both surfaces of the interposer, the semiconductor chip mount portion and the external connection terminals may be divided at the upper and the lower surfaces.

However, the semiconductor chip mount portion and the external connection terminals are disposed on the same surface of the interposer with the single layer wiring structure. In such a single layer wiring structure, it is required to have the cavity portion on the wiring surface with a depth at least comparable to a thickness of the chip so as to store the chip therein. A method of fabricating such a cavity portion has become an important subject.

Further, recently, smaller external connection terminals such as solder balls have been promoted and the reduction of its height when mounted and the realization of finer pitches for external connection terminals have been attempted. However, in order to obtain thinner and smaller semiconductor devices, the structure optimization is also an important issue for the structure such as the semiconductor chip mount portion and the wiring substrate in consideration of technical developments of those smaller external connection terminals.

The present invention is made by considering the above mentioned subjects. An object of the present invention is to provide a semiconductor device substrate for mounting a semiconductor chip(s) and other elements, a method of fabricating the semiconductor device substrate, a semiconductor device wherein a semiconductor chip(s) is mounted on the semiconductor device substrate, and a method of fabricating the semiconductor device, those of which enable to reduce the size, increase the reliability, reduce the cost, and make standardization of design and fabricating method easier.

Another object of the present invention is to provide a semiconductor device, a semiconductor device substrate therefor and methods of fabricating them, which allow reduction of the thickness and the size of the semiconductor device.

Still another object of the present invention is to provide a semiconductor device substrate having a cavity portion and a semiconductor device using the same, the cavity portion having a structure determined based on the size of external connection terminals to be used.

The above object of the present invention is accomplished by a semiconductor device substrate with a cavity portion, or a semiconductor device fabricated by mounting at least one semiconductor chip in the cavity portion and sealing with sealant, wherein said semiconductor device substrate comprises wiring disposed along a surface of the substrate and wall surfaces of the substrate in the cavity portion, the wiring comprises an external connection terminal portion for connecting to external connection terminals which are provided on the surface of the substrate at a side of the cavity portion being opened, an internal connection terminal portion for connecting to the mounted semiconductor chip, and a wiring portion disposed in between the external connection terminal portion and the internal connection terminal portion, the wiring portion is buried in a surface of the substrate and one of said wall surfaces of the substrate in the cavity portion and the internal connection terminal portion is disposed inside of the cavity portion.

For example, the wall surface of the substrate in the cavity portion may be extended toward the bottom surface of the cavity portion with a slant angle which is set within a predetermined angle range. Concretely, the slant angle may be within a range of 5–40°, and preferably within a range of 10–40°. In other words, the slant structure may be fabricated so as that a ratio L/G may be within ranges of $1.2<L/G<11$, $1.2<L/G<5.7$ respectively, where G is a height of the slant structure of the wall surface of the substrate in the cavity portion, and L is its horizontal dimension.

The cavity portion is, for example, formed by a press forming process utilizing a press pattern with a projected portion. The cavity portion may also be formed into a multiple step structure.

Alternatively, the cavity portion may be provided with a semiconductor chip mount portion for a mounting semiconductor chip, which is formed by hollowing the cavity portion out further. A depth of the semiconductor chip mount portion which has been hollowed out is preferably larger than a thickness of a semiconductor chip to be mounted therein.

Furthermore, a height difference of a ramp between the external connection terminal portion disposed on the substrate surface and the internal connection terminal portion disposed inside of the cavity portion may be preferably not less than 0.05 mm in the semiconductor device substrate and the semiconductor device according to the present invention.

The terminals of the semiconductor chip mounted inside of the cavity portion and the internal connection terminal portions are wire-bonded, or, directly connected by a face-down bonding.

Furthermore, the wiring in the semiconductor device substrate and the semiconductor device according to the present invention may be preferably disposed in an area of the wall surface which does not include any of corner sections of the cavity portion.

Furthermore, the cavity portion may be formed substantially at the center of the major surface plane of the substrate, and the semiconductor chip may be mounted inside of the cavity portion so as the semiconductor chip to be positioned substantially at the center of a dimension of the thickness of the semiconductor device substrate. Alternatively, the semiconductor chip may be offset-mounted in the cavity portion with an offset amount of not bigger than 30% of the substrate thickness from the center position of the substrate's thickness along a direction of the thickness. The cavity portion may have a size large enough to mount a plurality of device elements on its bottom surface area, and may be provided with a plurality of wiring sets to the plurality of device elements, and a plurality of semiconductor chips and passive device elements may be mounted in the cavity portion.

Furthermore, the wiring in the semiconductor device substrate and the semiconductor device according to the present invention is preferably formed by utilizing a squeeze shapeable wiring construction body consisting of only metals, the squeeze shapeable wiring construction body having a multiple layer structure including at least the first metal layer for constructing the wiring and the second metal layer which functions as a carrier layer.

Furthermore, a depth of the cavity portion may be less than a thickness of the semiconductor chip to be mounted, and the cavity portion may be hollowed out at the bottom surface of the cavity portion from the center portion along a direction of a thickness of the semiconductor device substrate up to a depth within a range of 0.5–2.5 times a thickness of the semiconductor chip to be mounted. Alternatively, a depth of the cavity portion may be less than a thickness of the semiconductor chip to be mounted, and the cavity portion may be hollowed out at the bottom surface of the cavity portion, and the semiconductor device substrate may be further comprising a resin layer formed by hardening prepregs so as to have an exposed hollowed-out bottom surface at least consisting of nonwoven fabrics. In this case, a metal plate with a thickness of not less than 0.035 mm may be adhered to a reverse side of the resin layer wherein the cavity portion was formed, a depth of the cavity portion may be less than a thickness of the semiconductor chip to be mounted, and the bottom of the cavity portion may be hollowed out to expose the metal plate. Alternatively, a metal plate with a thickness of not less than 0.20 mm may be adhered to the reverse side of the resin layer wherein the cavity portion was formed, a depth of the cavity portion may be made to be less than a thickness of the semiconductor chip to be mounted, and the bottom of the cavity portion may be hollowed out into the metal plate as much as the hollowed out depth in the metal plate is not less than 0.05 mm.

Furthermore, the hollow-out process of the resin layer may be stopped before reaching the metal plate.

The above object of the present invention may be accomplished by a fabricating method of a semiconductor device substrate, comprising the steps of: pressing to adhere a squeeze shapeable wiring construction body to a resin substrate, the wiring construction body consisting of all metals and having a multiple layer structure comprising at least the first metal layer and the second metal layer which functions as a carrier layer; coincidentally shaping the resin substrate so as to form a cavity portion therein with its wall surfaces having inclination angles within a predetermined range; and removing the metal layers except the first layer; wherein the wiring, which is buried in the substrate surface and wall surface of the substrate in the cavity portion, is formed and disposed along the substrate surface and the wall surface of the substrate in the cavity portion; and the wiring comprising an external connection terminal portion for connecting to external connection terminals disposed on a surface of the substrate on a side of the cavity opening, an inner connection terminal portion for connecting to a semiconductor chip to be mounted, and a wiring portion in between the external connection terminal portion and the inner connection terminal portion.

A percentage elongation after fracture of the squeeze shapeable wiring construction body is preferred to be not less than 2%. A thickness of the carrier layer composing the squeeze shapeable wiring construction body is preferred to be within a range of 0.010–0.050 mm. A slant angle range of the wall surface of the substrate in the cavity portion is preferred to be from 5° to 40°, and a depth of the cavity portion is preferred to be at least not less than 30% of a thickness of a semiconductor chip to be mounted.

The hollow-out process may be performed on the bottom surface of the cavity portion after the cavity portion is formed, and after the hollow-out process, other metal layers may be removed. Performing the hollow-out process while having the other metal layers enable to increase a process accuracy at hollowed out edges.

The above object of the present invention may be accomplished by a fabricating method of a semiconductor device substrate having at least one cavity portion for mounting at least one semiconductor chip and wiring, comprising the steps of: a step for making a depth of the cavity portion less than a thickness of a semiconductor chip to be mounted, and a step for hollowing out the cavity portion at the bottom surface, wherein the wiring to the semiconductor chip mounted is cut during the hollow-out process, and the cut edge portion of the wiring reaches a fringe portion of a cavity portion formed by the hollow-out process. Accordingly, a process accuracy at edges of the cavity portion may be increase.

According to the present invention, a fine pitch wiring corresponding to a connection pitch of the semiconductor chip may be disposed while forming the cavity portion which is capable of mounting the semiconductor chip, and is suitable for an area array type semiconductor package. The semiconductor package utilizing this technology is suitable for CSP (Chip Scale Package), FBGA (Fine Pitch Ball Grid Array), BGA (Ball Grid Array), LGA (Land Grid Array) or the like.

In order to accomplish the another objects, there is provided, according to one aspect of the present invention, a semiconductor device fabricated by forming at least one cavity portion on a semiconductor device substrate, mounting at least one semiconductor chip in the cavity portion, and sealing with sealant, wherein the semiconductor device substrate includes wiring disposed along surface of the semiconductor chip substrate and wall surfaces of the substrate in the cavity portion. The wiring includes an external connection portion for connecting to external connection terminals which are provided on the surface of the semiconductor device substrate at a side of the cavity portion's opening, an internal connection portion for connecting to the mounted semiconductor chip, and a wiring portion disposed between the external connection portion and the internal connection portion. Further, a depth of the cavity portion may be determined in accordance with a predetermined instruction based on a height of the external connection terminals.

More specifically, the internal connection portion may be positioned inside of the cavity portion and a depth from the surface of the semiconductor device substrate to the position of the internal connection portion is preferably not less than (0.3–0.8α) mm where a height of the external connection terminal is α (mm).

The cavity portion may be provided with a semiconductor chip mount portion for mounting a semiconductor chip, which is formed by further hollowing out the cavity portion. A depth of the semiconductor chip mount portion is preferably a value in a range of predetermined values, the range may be including a thickness of a semiconductor chip to be mounted therein.

Preferably, when the semiconductor device is mounted on a mother substrate, a space between the mother substrate and the surface of the semiconductor device substrate may be from 0.7α to α and a space between the mother substrate and the surface of the sealant may be not less than 0.1 mm.

Still further, a height α of the external connection terminal may be preferably a value in a range from 0.05 to 0.3 mm, and a distance from a pad side surface of the mounted semiconductor chip to the sealant surface is preferably in a range of 0.15 to 0.2 mm.

Also, in order to accomplish the another objects, there is provided, according to another aspect of the present invention, a fabricating method of a semiconductor device substrate including at least one cavity portion in which at least one semiconductor chip is mounted, includes the steps of, for the semiconductor device substrate, pressing to adhere a squeeze shapeable wiring construction body to a resin substrate, the wiring construction body having a multiple layer structure including at least the first metal layer which is used as a wiring portion and the second metal layer which functions as a carrier layer, while forming a cavity portion the resin substrate and removing the metal layers except the first layer. The wiring, which is buried in the resin substrate surface and wall surface of the cavity portion, is formed and disposed along the resin substrate surface and the wall surface of the cavity portion. The wiring includes an external connection portion for connecting to external connection terminals disposed on a surface of the resin substrate on a side of the cavity opening, an inner connection portion for connecting to a semiconductor chip to be mounted, and a wiring between the external connection portion and the inner connection portion. A depth of the cavity portion is determined based on a height of the external connection terminal.

Furthermore, the semiconductor devices and the substrates in accordance with various aspects of the present invention described above may further comprise metal layers or plates for heat dissipation.

DETAILED DESCRIPTION OF THE PREFERRED EMBODIMENTS

Figure 1:
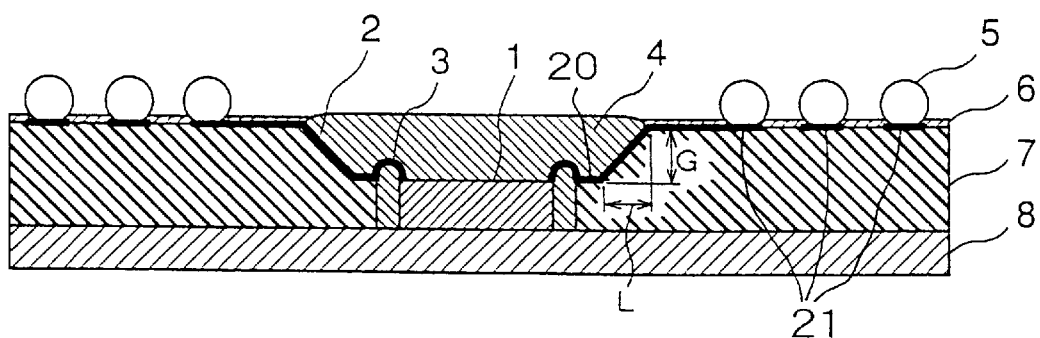
FIG. 1 is a cross sectional view showing an example of a cross sectional structure of a semiconductor device according to the present invention.

Embodiments according to the present invention will now be explained with reference to the drawings. However, the present invention is not only limited to the following embodiment.

An embodiment of a semiconductor device in accordance with the present invention will now be explained with reference to FIGS. 1–4.

As shown in the figures, the semiconductor device in the present embodiment comprises a semiconductor element (chip) 1, an insulator substrate(semiconductor device substrate) 7 with a cavity portion or a through hole portion to mount the semiconductor chip 1 or the semiconductor chip mount portion formed by hollowing out in the cavity portion, external electrodes (external connection terminals) 5 which are disposed on a surface plane of the insulator substrate 7 to establish electrical connections to the semiconductor chip 1 and outside of the device when the device is packaged, and sealant 4 for sealing the cavity portion or the through hole portion after the semiconductor chip 1 is mounted therein.

The semiconductor device of the present embodiment further comprises wiring 2 for electrically connecting the semiconductor chip 1 and the external electrodes 5. The wiring 2 comprises an inner connection terminal portion 20 connected to wire 3 for connecting the semiconductor chip 1 by wirebonding, an external terminal portion 21 connected to the external electrode 5, and a wiring portion between inner connection terminal portion 20 and external connection terminal portion 21. A ramp is formed between inner connection terminal portion 20 and external connection terminal portion 21 of the semiconductor device.

Wiring 2 connecting wires 3 and external electrodes 5 is buried continuously into a surface layer of insulator substrate 7 from a point where the external electrodes 5 are disposed to a surface layer of the cavity portion wall or its bottom plane. The semiconductor chip 1, the wires 3, the connection portion between the wires 3 and the wiring 2 (inner connection terminal portion), and major parts or all parts of the wiring 2 are disposed inside the cavity portion and sealed by the sealant 4.

Figure 2:
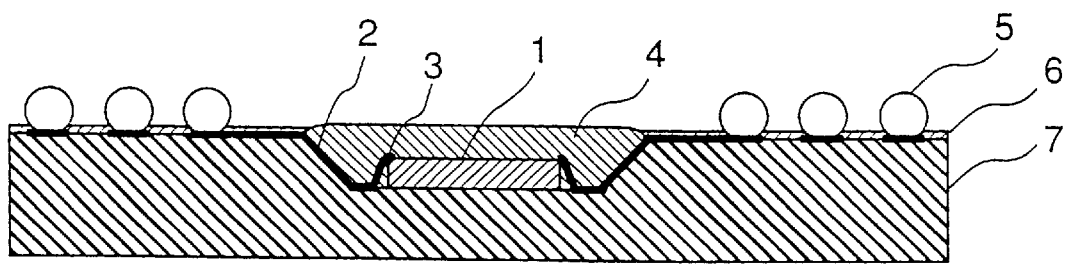
FIG. 2 is a cross sectional view showing another example of the cross sectional structure of the semiconductor device according to the present invention.
Figure 3:
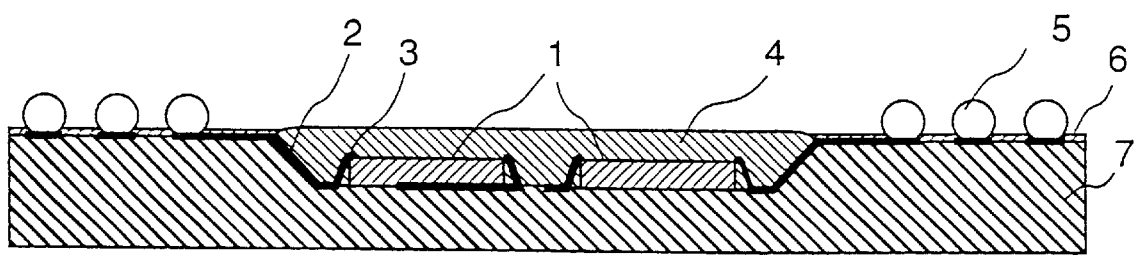
FIG. 3 is a cross sectional view showing an example of a cross sectional structure of the semiconductor device according to the present invention, in which a plurality of semiconductor chips are mounted.
Figure 4:
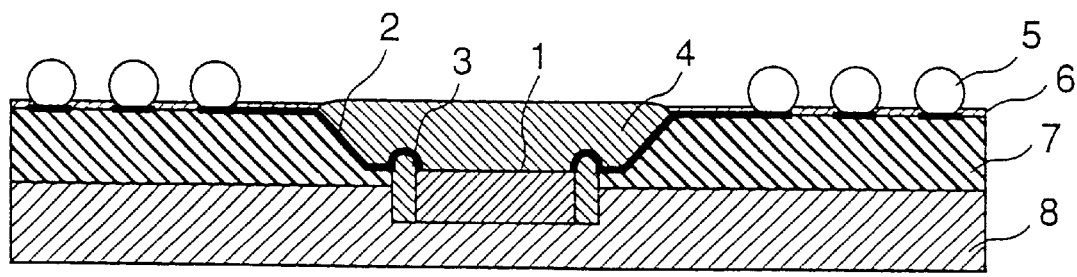
FIG. 4 is a cross sectional view showing an example of a cross sectional structure of the semiconductor device according to the present invention, having an efficient heat dissipation function.
Figure 5:
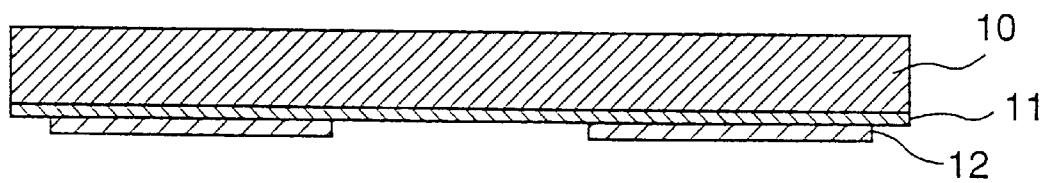
FIG. 5 is a cross sectional view showing an example of a cross sectional structure of a wiring construction body which is made of all metals and can be squeeze-shaped.

Numeral 6 in FIGS. 1–4 indicates a surface insulation layer formed on a surface of the insulator substrate 7, and numeral 8 in FIGS. 2 and 5 indicates a metal plate disposed on the bottom surface side of the insulation layer 7.

The semiconductor device and the semiconductor device substrate utilize a squeeze shapeable wiring construction body having a multiple layer construction including at least a first metal layer and a second metal layer which functions as a carrier layer. Wiring varied in a surface of a resin substrate and walls of a cavity may be fabricated by pressing to adhere the squeeze shapeable wiring construction body to the resin substrate, coincidentally shaping the resin substrate so as to form the cavity portion therein with its inclination wall surfaces, and removing the metal layers except the first layer. The wiring may be provided for connecting semiconductor chip 1 and external electrodes 5. The wiring comprises an external terminal portion connected to an external electrode and disposed on the resin substrate surface in which the cavity opening is disposed, an inner connection terminal portion connected to the semiconductor chip to be mounted, and a wiring portion between the inner connection terminal portion and the external connection terminal portion.

When the squeeze shapeable wiring construction body is pressed and adhered to the resin substrate, and all the metal layers except the first layer are removed, three surfaces of the first metal layer, i.e. the wiring, which were not faced to the other metal layer, are buried into the resin substrate, and the surface which had been faced to the other metal layer is exposed at a plane coinciding a surface plane of the resin substrate.

The squeeze shapeable wiring construction body may have a multiple layer structure at least comprising the first metal layer functioning as the wiring and the second metal layer functioning as its carrier layer, or may comprise the first metal layer functioning as the wiring, which is formed from a metal foil by carrying out a half etching process using a predetermined resist pattern from a side of the metal foil, and the second metal layer functioning as its carrier layer.

When the squeeze shapeable wiring construction body is pressed and adhered to the resin substrate, and the other metal layers except the first metal layer are removed, parts of the other metal layers may be left to form the inner connection terminal portions, the external connection terminal portions or the like, for example.

The cavity portion is press formed with a mating projected die. The semiconductor chip mount portion for mounting the semiconductor chip 1 is embodied by the cavity portion itself or by hollowing the cavity portion out further. There, the cavity portion may be formed from a plurality of cavities.

A depth of the semiconductor chip mount portion formed from the cavity portion itself or by further hollowing the cavity portion out may preferably be equal to or larger than a thickness of the semiconductor chip 1 to be mounted.

If the cavity portion should be hollowed out further, the other metal layer (the carrier layer) may be removed after the hollowing-out process.

A slant angle of a slant portion wherein the wiring 2 is disposed in the present embodiment may be set to a value within a predetermined angle range which is set in correspondence with fabricating conditions in the fabricating method of the semiconductor device substrate described in detail hereafter.

Concretely, the slant angle of the wall surface of the cavity portion may be set to a value within a range between 5 and 60 degrees. More preferably, the value may be set within a range between 10 and 60 degrees. The slant angle may be determined according to not only a shape of the die used for the press forming but also physical characteristics of the wiring construction body (transfer metal foil) which may be squeeze-shaped and used for fabricating the wiring 2, or fabricating conditions during the cavity portion press forming, or the like.

The slant portion may also be characterized by a height of the slant portion G and a horizontal length L (see FIG. 1). As to the slant portion of the semiconductor device in one embodiment, a ratio L/G may be set within a range 1.2<L/G<11. More preferably the ratio L/G may be set within a range 1.2<L/C<5.7.

Furthermore, a height of the ramp is preferably 30% of a thickness of the semiconductor chip 1 to be mounted. Typically, the thickness of the semiconductor chip 1 is in a range between 0.2 and 0.5 mm. Accordingly, the ramp height should be at least in a range between 0.06 and 0.15 mm.

The ramp height may be varied in accordance with a height of the external electrodes 5. When solder balls are used as the external electrodes 5 as shown in FIGS. 1–4, a margin in the ramp height may be varied in accordance with a size of the solder ball. For example, if a diameter of the solder ball is about 0.7 mm, the sufficient distance between the package and a mother board may be accommodated with utilizing a low profile wire bonding process and keeping a height of the resin sealant 4 to less than about 0.2 mm. It will be difficult to provide the sufficient distance between the package and the mother board without the cavity portion if the diameter of the solder ball is less than 0.4 mm.

Furthermore, it is necessary to dispose a wire bonding connection portion inside the cavity portion for LGA (Land Grid Array) without using the solder balls.

Corner portions are the most easily breakable part when the ramp of a square or rectangular shape is fabricated in the insulator substrate 7 for mounting the semiconductor chip 1. The corner portions may be largely deformed even if it were not broken. Accordingly, it is preferable not to have the wiring at the corner portion since it may cause some troubles in a long term and lower the reliability if the wiring is disposed in the corner section. If the wiring should be disposed in the corner section, it may be preferable to set R (rounding portion) in the corner section round.

Furthermore, the semiconductor chip 1 may be mounted in the cavity portion of the insulator substrate 7 in such a way that the mounted semiconductor chip 1 is positioned at the center portion of the substrate in a direction along its thickness. Accordingly, a warp of the semiconductor device when heat cycles are applied may be controlled under a smaller value.

When the semiconductor chip is offset mounted from the center portion, a substantial reliability, which is related to a rigidity of the substrate and an amount of cure shrinkage of the resin sealant, may be ensured up to an offset amount of 30% of the substrate thickness.

The mount portion for mounting the semiconductor chip 1 may be formed not only by the press forming of the cavity portion but also by hollowing out an additional cavity inside the cavity portion as shown in FIGS. 1 and 4 so as to fabricate various types of the semiconductor device substrates. The hollowing out process is widely used in a print wiring board industry. An end mill apparatus may be used to conduct the hollow out process mechanically while controlling machining dimensions precisely in XYZ directions.

In one embodiment, a depth of the hollowed out cavity may be required to be set within a range between 0.5 times and 2.5 times the thickness of the chip to be mounted. This is related to how easily the wire bonding connection can be fabricated. In a low loop wire bonding with a lower profile, it is preferred to have less height difference between a chip side bonding location and a substrate side bonding location.

A surface condition of the hollowed out plane affects the adherence nature with the semiconductor chip 1 and with the sealant 4. When the substrate 7 for mounting the semiconductor chip 1 is fabricated from continuous glass fiber of a fabric type, the glass fiber and the resins may be detached at the hollowed out plane. A wettability with the sealant or die bonding resin is low at the hollowed out plane, and the adhesive force is weaker in such a case. When nonwoven fabric is used, the hollowed out plane becomes smooth since the nonwoven fabric is composed of short glass fibers. Accordingly, the wettability with the sealant or die bonding resin is high at the hollowed out plane, and thus the adhesive force is stronger. The fabricating method will be described in detail in the following.

Furthermore, the substrate may be fabricated by forming the wiring and a cavity portion at the center portion of the insulator substrate 7 with an insufficient depth for mounting the semiconductor chip, hollowing out the cavity portion further, and cutting a part of the wiring 2 during the hollow out process so as that the end portion of the wiring 2 may reaches the brink of the cavity portion formed by the hollow-out process.

Furthermore, as shown in FIG. 3, the substrate may be fabricated by forming the wiring 2 and a cavity portion, wherein a plurality of components may be mounted, at the center portion of the insulator substrate 7 so as to mount a plurality of semiconductor chips and/or passive elements in the cavity portion. The wiring 2 may be used for wiring between the semiconductor chips within the cavity portion, and between inside and outside of the cavity portion.

Furthermore, a metal portion which can be functioned as a heat dissipation layer or the like may be simultaneously integrated into one body when a metal plate is placed at the bottom side during the press forming of the cavity portion.

Furthermore, as shown in FIG. 4, the substrate may be fabricated by hollowing out the insulator substrate 7 with the metal plate 8 attached to the bottom side so as to expose a metal surface at the bottom plane of the cavity portion. It is necessary to cut into the metal plane when the end mill is used in the hollow out process to expose the metal layer surface. Accordingly, the metal plate 8 is required to have an sufficient thickness. If a thin metal plate should be used, it will be difficult to make a substantial compensation with an order of precession comparable to a thickness of the plate during the end mill machining. However, it will be possible to fabricate such a substrate by utilizing a laser beam process or plasma process or resin etching, or utilizing these process with the end mill machining. Alternatively, the substrate may be fabricated by hollowing through the substrate at a portion need to be hollowed out and adhering another substrate or a metal plate.

Methods of fabricating the semiconductor device in the present embodiment will now be explained with reference to FIGS. 5–9.

The first example will now be described.

Figure 6:
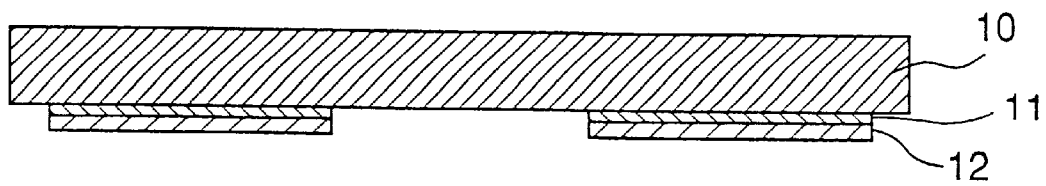
FIG. 6 is a cross sectional view showing another example of the cross sectional structure of the wiring construction body which is made of all metals and can be squeeze-shaped.

In the instant example of the fabricating method, a three layer structure foil is utilized as a transfer metal foil for fabricating wiring which may comprise the wiring 2 as shown in FIG. 5 or FIG. 6 for example. The three layer structure foil is formed by plating a 0.5 μm thick nickel layer 11 over a 35 μm copper foil 10 (carrier foil) and further forming a 5 μm copper layer 12 thereon. This copper foil is fabricated by NIHON DENKAI Co.

The transfer metal foils having structures other than the instant example may be also used in the present invention as long as it comprises from all metal substances and includes no resin. Namely, the transfer metal foil is preferred to have at least a carrier layer (the copper foil 10 in the instant example) and a wiring layer (the copper layer 12 in the instant example). When the same type of metal is used for the carrier layer and the wiring layer, a barrier layer (the nickel layer 11 in the instant example) comprising the different type of metal should be provided between the layers. The carrier layer and barrier layer will be removed by etching in later process.

The transfer metal foil is required to have a percentage elongation after fracture of not less than 2% within a process temperature range (press). A thickness of the carrier layer of the transfer metal foil is preferably within a range between 0.018–0.075 mm. Handling of the transfer metal foil may become difficult if the carrier layer is thinner than the above range, and shaping in accordance with the die may become difficult if the carrier layer is thicker than the above range.

In the instant example, the copper layer 12 with 5 μm thickness is employed as the wiring, and is etched after forming a resist pattern with a conventional photo-resist method. The etching solution is needed to have a selectivity for etching only copper and not nickel. Alkali etchants which are widely used in the print board industry are preferred as the etching solution. The carrier layer 10 with 35 μm thickness is protected by the resist from being etched.

Figure 7:
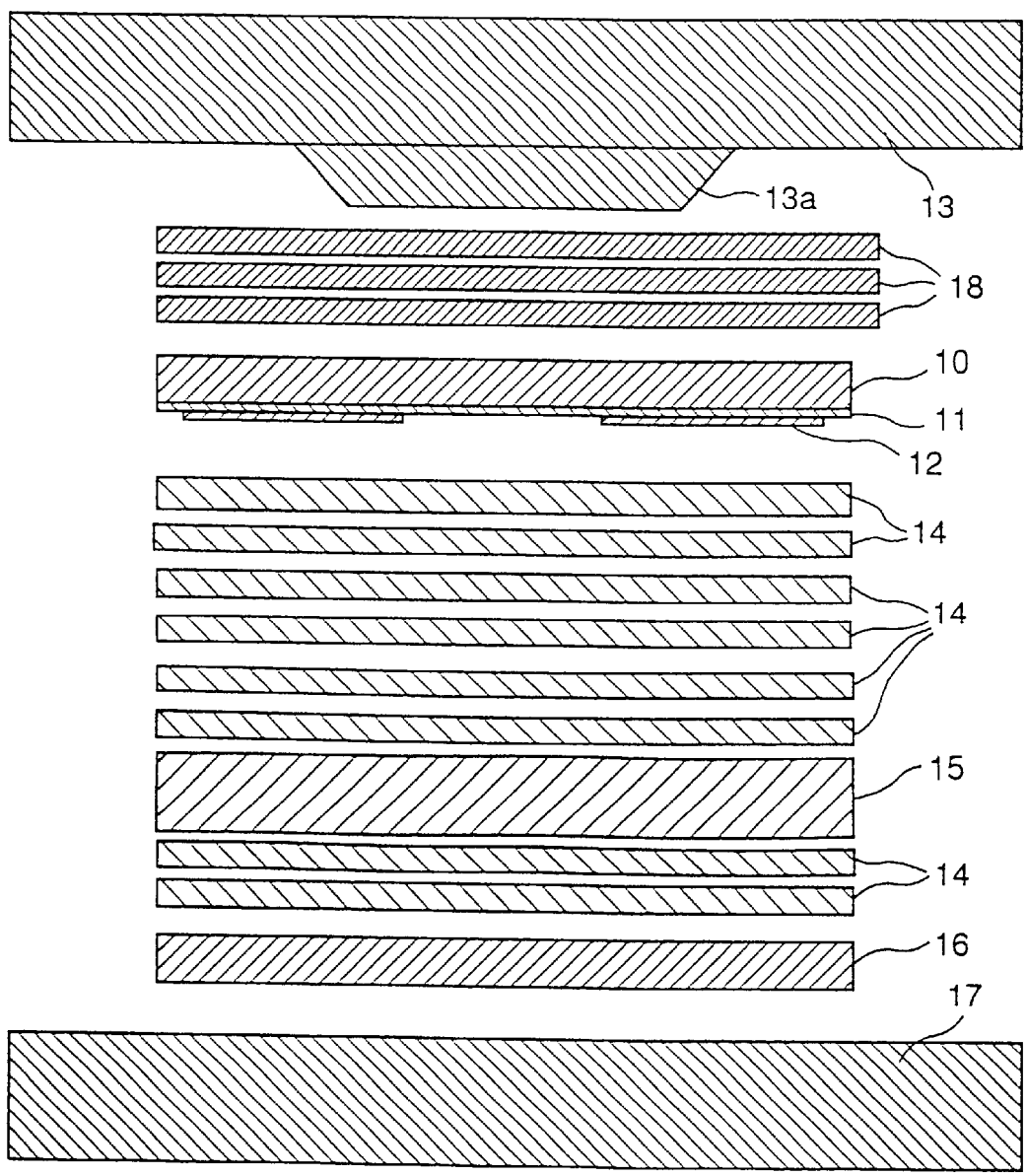
FIG. 7 is an explanatory view illustrating an example of material compositions for press shaping wherein non-woven fabric prepregs are included in the material composition.

The patterned copper foils 10–12 are heat pressed in an arrangement shown in FIG. 7 for two hours at a temperature of 180° C. and a pressure of 25 kg/cm². FIG. 7 illustrates the arrangement between the press shaping upper die 13 and the press shaping lower die 17, where a plurality of aluminum foils 18, the patterned copper foil with the three layer structure (copper foil 10, nickel alloy 11, copper wiring 12), a plurality of glass fabric base epoxy resin prepregs 14, nonwoven fabric base epoxy resin prepreg 15, glass fabric base epoxy resin prepreg 14 and 1.0 mm thick copper foil 16 functioned as the metal plate are arrayed from top to bottom of the figure.

A cross sectional shape of a projected part 13a of the press shaping upper die 13 is trapezoidal, and its height is 0.15 mm and a slant angle of its side surfaces is 45°. Three aluminum foils 18, each with a thickness of 25 μm, are placed in between the die and the copper foil 16 so as to provide a cushion layer during the press shaping process. GEA-679 (product name, fabricated by Hitachi Chemical Company, Ltd.) impregnated epoxy resin into a glass fabric base, is used as the prepregs.

In the instant example, eight pieces of the glass fabric base epoxy resin prepregs 14 each with 0.1 mm thickness are used in total. Furthermore, a piece of the glass fiber made nonwoven fabric base epoxy resin prepreg 15 with 0.2 mm thickness is used. The nonwoven fabric base epoxy resin prepreg is placed between the sixth and seventh piece of the glass fabric base epoxy resin prepregs. A glass epoxy resin substrate fabricated under the conditions described above contains a plurality of device units, each comprising the same wiring and the same cavity portion. The carrier copper foil 10 of the glass epoxy substrate is etched by the alkali etchant described above to remove the carrier copper foil 10 from the whole surface area, and then the nickel layer 11 is etched away by an etching solution for selectively etching nickel.

According to the above mentioned conditions, the cavity portions each with 0.15 mm depth are formed on the copper plate with 1.0 mm thickness, and the continuous wiring is disposed at the surface layers including surfaces of the cavity portions. The cavity portions of the substrate are further milled to a depth of 0.55 mm by the end milling machine for adjusting the depth so as to be able to mount the semiconductor chips. Solder resist layers are formed using a conventional method, and 5 μm thickness of nickel and 0.5 μm thickness of gold are plated at the terminal portions.

The semiconductor chip 1 of 0.28 mm thickness is adhered in the cavity portions, and connected by the wire bonding. The semiconductor chip 1 and the wire bonding portion (wire 3 and the inner connection portion of the wiring 2) are sealed by the resin sealant 4. After the solder balls are attached as the external connection terminal 5, the substrate is diced and separated by the unit to complete the fabrication of the semiconductor device.

According to the fabricating method described above, the structure shown in FIG. 1 may be obtained, for example. Such a construction enables to fabricate a comparatively smaller package which is closer to the chip size, the chip scale package.

The second example will now be described.

The three layer structure foil, formed by plating a 0.5 μm thick nickel layer over a 35 μm copper foil (carrier foil) and further forming a 5 μm copper layer, is also used in the instant example of the fabricating method. The copper foil is made by NIHON DENKAI Co.

The copper layer with 5 μm thickness is etched after forming a resist pattern with a conventional photo-resist method. The etching solution is needed to have a selectivity for etching only copper and not nickel. Alkali etchants which are widely used in the print board industry are preferred. The carrier layer with 35 μm thickness is protected by the resist from being etched.

Figure 8:
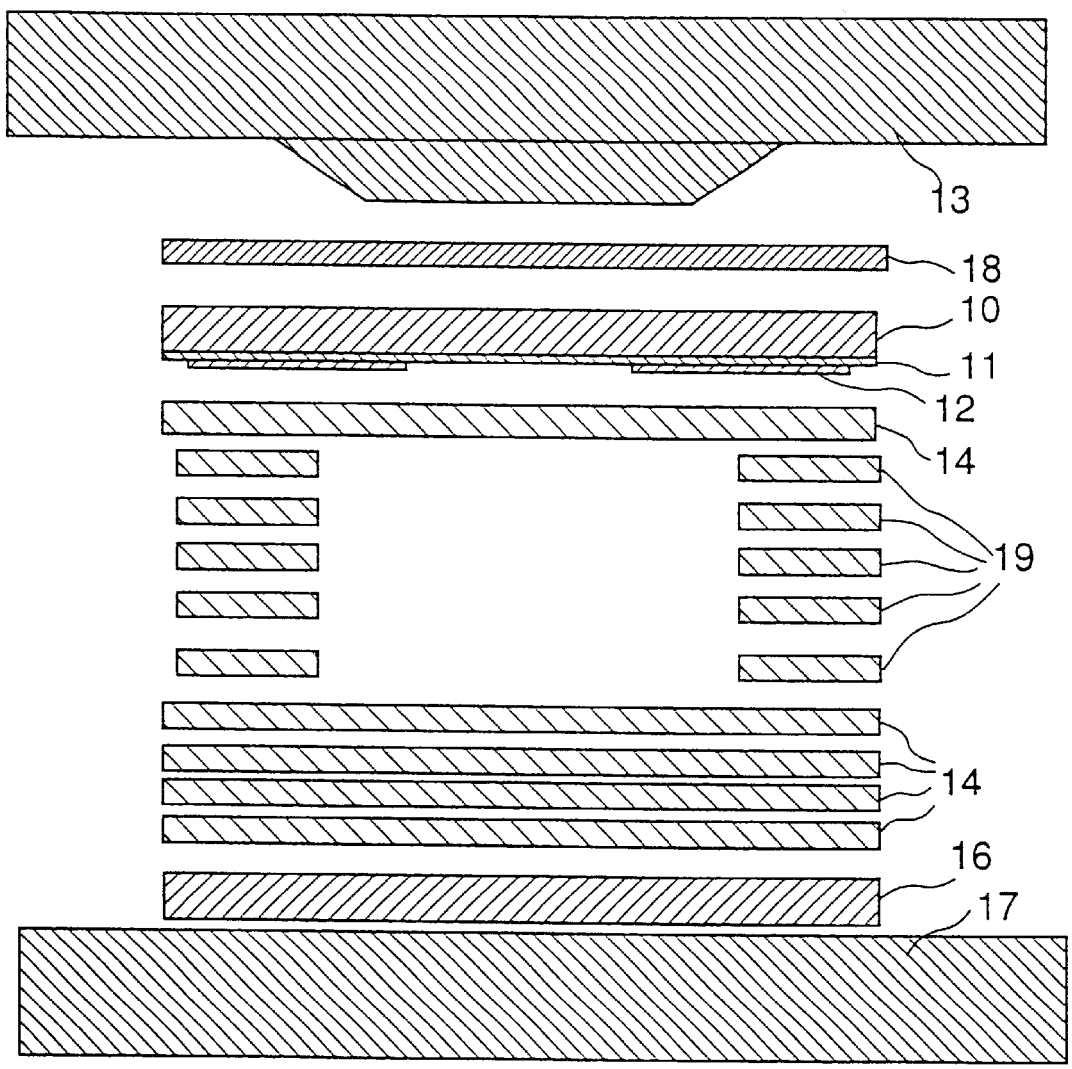
FIG. 8 is an explanatory view illustrating an example of material compositions for press shaping wherein bored through prepregs are included in the material composition.

The patterned copper foils (wiring construction body) comprising the copper foil 10, the nickel alloy (nickel layer) 11 and the copper layer 12 are heat pressed in the arrangement shown in FIG. 8 for two hours at a temperature of 180° C. and a pressure of 25 kg/cm². FIG. 8 illustrates the arrangement between the press shaping upper die 13 and the press shaping lower die 17, where an aluminum foil 18, the patterned copper foils in the three layer structure (copper foil 10, nickel alloy 11, copper wiring 12), a glass fabric base epoxy resin prepreg 14, a plurality of prepregs 19, which is the same kind as the prepreg 14 having hollowed through portions, a plurality of glass fabric base epoxy resin prepregs 14, and the copper foil 16 functioning as the metal plate are arrayed from top to bottom of the figure.

A height of a projected part of the press shaping upper die 13 is 0.5 mm and a slant angle of its side walls is 30°. A piece of the aluminum foil with a thickness of 25 μm is placed in between the die and the copper foil so as to provide a cushion layer during the press shaping process.

The GEA-679 (product name, Hitachi Chemical Company, Ltd.) fabricated by impregnating epoxy resin into glass fabric is used as the prepreg. The prepregs are hollowed out at positions corresponding to the projected portions of the upper die 13. These hollowed-out prepregs are piled so many layers as to make the total thickness of the hollowed-out prepregs comparable to the height of the projected portion. In the instant example, five pieces of the hollowed-out glass fabric base epoxy resin prepregs with 0.1 mm thickness and five pieces of the glass fabric base epoxy resin prepregs without a hole are used for the projected portion of 0.5 mm height.

The glass epoxy substrate fabricated by the conditions described contains a plurality of device units, each comprising the same wiring and the same cavity portion. The carrier copper foil 10 of the glass epoxy substrate is etched by the alkali etchant described to remove the carrier copper foil 10 from the whole surface area, and then the nickel layer 11 is etched away with an etching solution for selectively etching nickel.

According to the above mentioned conditions, cavity portions of 0.5 mm depth are formed on the substrate of 1 mm thickness, and the continuous wiring is buried at the surface layer including surface planes in the cavity portions. Solder resist layers are formed using a conventional method, and layers of a 5 μm thick nickel and a 0.5 μm thick gold are plated at the external connection terminal portions of the external connection terminal position. The semiconductor chips 1 are adhered in the cavity portions, and connected by the wire bonding. The chip and the wire bonding portion are sealed by the resin sealant 4. After the solder balls 5 are attached, the substrate is diced and separated by the device unit to complete the fabrication of the semiconductor device.

According to the fabricating method described above, the structure, not shown, in which the metal plate is attached at the bottom side of the substrate as shown in FIG. 2 or 3, may be embodied, for example. Such a structure enables to decrease the fabricating cost since no hollow out process is required though the package size becomes larger. This is due to longer slant portions with less slant angle. Furthermore, there is a merit of being able to mount a plurality of semiconductor chips and simultaneously form the wiring between the semiconductor chips, as shown in FIG. 3.

The third example will now be described.

The three layer structure foil, formed by plating a 0.5 μm thick nickel layer over a 35 μm copper foil (carrier foil) and further forming a 5 μm copper layer, is used in the instant example of the fabricating method. The copper foil is fabricated by NIHON DENKAI Co.

The copper layer with 5 μm thickness is etched after forming a resist pattern with a conventional photo-resist method. The etching solution is required to have a selectivity for etching only copper and not nickel. Alkali etchants which are widely used in the print board industry are preferred. The carrier layer with 35 μm thickness is protected by the resist from being etched.

Figure 9:
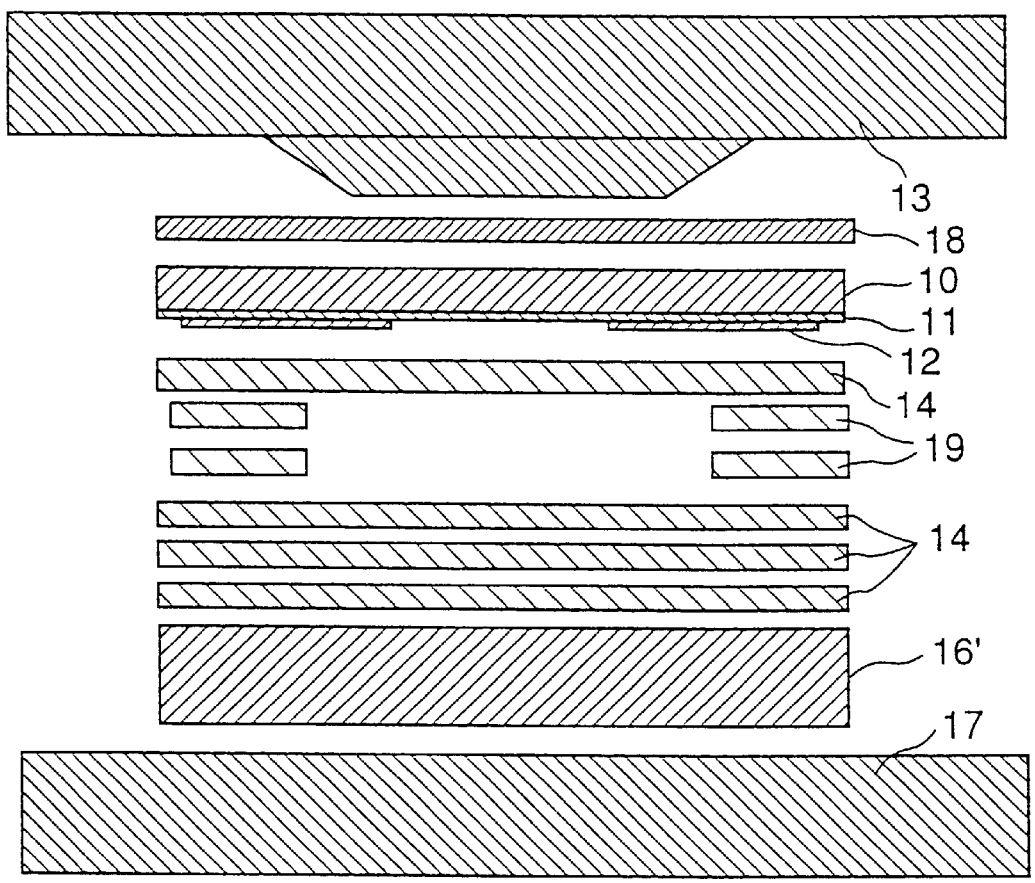
FIG. 9 is an explanatory view illustrating an example of material compositions for press shaping to fabricate an efficient heat dissipation type with a metal plate adhered to the back surface.

The patterned copper foils are heat pressed in the arrangement shown in FIG. 9 for two hours at a temperature of 180° C. and a pressure of 25 kg/cm². FIG. 9 illustrates the arrangement between the press shaping upper die 13 and the press shaping lower die 17, in which an aluminum foil 18, the patterned copper foils with the three layer structure (copper foil 10, nickel alloy 11, copper wiring 12), a plurality of glass fabric base epoxy resin prepregs 14, 19, and a copper plate 16' as the metal plate are arrayed from top to bottom of the figure.

A height of a projected part of the die is 0.20 mm and a slant angle of its side walls is 30°. A piece of the aluminum foil 18 with a thickness of 25 μm is placed in between the die and the copper foil to provide a cushion layer during the press shaping process.

Six pieces of the prepregs, GEA-679 (product name, Hitachi Chemical Company, Ltd.), which is fabricated by impregnating epoxy resin into glass fabric, with a thickness of 0.1 mm are used. The second and third prepregs 19 are hollowed out at positions corresponding to the projected portions of the upper die 13. Furthermore, the copper plate of 0.40 mm thickness, to which an adhesion roughing process is carried out, is disposed in the bottom side of the substrate, and the press forming process is executed. The total thickness after the press forming process is 1.0 mm.

The glass epoxy substrate fabricated by the conditions described above comprises a plurality of device units each comprising the same wiring and the same cavity portion. The carrier copper foil 10 of the glass epoxy substrate is etched by the alkali etchant described above to remove the carrier copper foil from the whole surface area, and then the nickel layer is etched away by an etching solution for selectively etching nickel.

According to the above mentioned conditions, the cavity portions of 0.20 mm depth are formed in the substrate with 1.0 mm thickness, and the continuous wiring is disposed at the surface layer including surface planes of the cavity portions. The substrate is milled further by an end milling machine up to 0.65 mm depth for mounting semiconductor chips. Solder resist layers are formed using a conventional method, and layers of 5 μm thickness of nickel and 0.5 μm thickness of gold are plated at the terminal portions.

The semiconductor chips 1 are adhered in the cavity portions, and connected by the wire bonding. The semiconductor chip 1 and the wire bonding portion are sealed by the resin sealant 4. After the solder balls 5 are attached, the substrate is diced and separated by the device unit to complete the fabrication of the semiconductor device.

According to the fabricating method described above, the structure shown in FIG. 4 may be obtained, for example. Such a structure enables to decrease the fabricating cost and attain high reliability since the heat dissipation plate may be attached to the substrate within the same press forming process.

According to the first to third examples of the present embodiment, it is possible to provide a semiconductor device substrate for mounting a semiconductor chip(s) and a method of fabricating the semiconductor device substrate, and a semiconductor device wherein a semiconductor chip (s) is mounted on the semiconductor device substrate, those of which enable to reduce the size, increase the reliability, reduce the cost, and make the standardization of design and fabricating process easier.

Next, another embodiments of the semiconductor device, the semiconductor device substrate and the fabricating method of the present invention are now explained with reference to FIGS. 10–16.

The semiconductor device of the present embodiment is fabricated by forming cavity portions at parts of a wiring substrate and mounting semiconductor chips in the cavity portions. In the semiconductor device, continuous wiring conductors are buried in a surface layer of the wiring substrate, which includes surfaces of the cavity portions.

Figure 10:
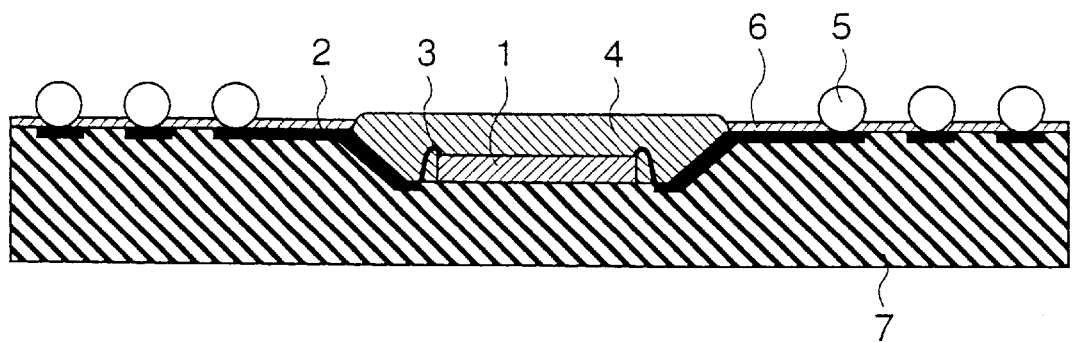
FIG. 10 is a cross sectional view showing another example of the semiconductor device according to the present invention.

Concretely, as shown in FIG. 10, for example, the wiring substrate having two or more surface layers with different heights is formed by providing an external connection terminal portion connecting to the external electrode 5 in the first surface layer, providing an inner connection terminal portion connecting to the semiconductor chip 1 on the second surface layer, providing a ramp with a height not less than 0.05 mm between the first and second layers, and burying the continuous wiring conductors on the first surface layer, the second surface layers and surface layers in between.

The wiring substrate may be embodied by the fabricating method wherein the wiring conductor is formed on a metal foil such as copper or the like, and the metal foil is adhered to the resin layer at the same time the cavity portion is formed.

The wiring substrate may be also embodied by a fabricating method of the semiconductor device substrate with the cavity portion by pressing a pile of prepregs impregnating the resin and the metal foil comprising the wiring conductor, wherein parts of the prepregs corresponding to the cavity portions are removed prior to the pressing process.

Figure 11:
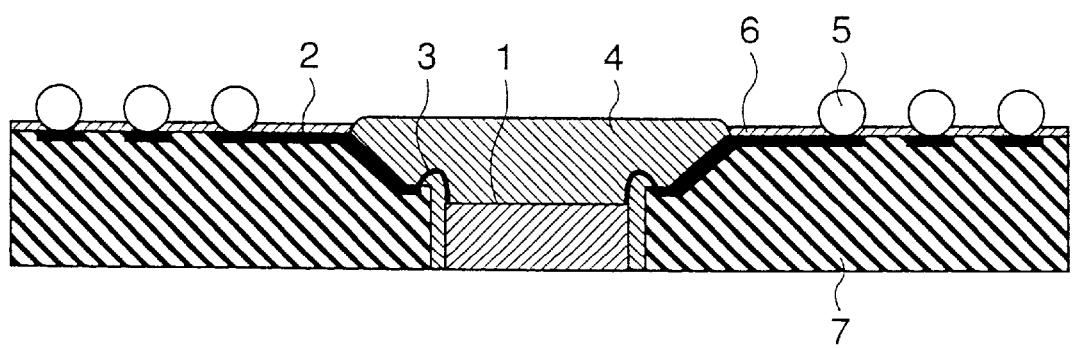
FIG. 11 is a cross sectional view showing another example of the semiconductor device according to the present invention.

In another example of the present embodiment of the semiconductor device substrate with the cavity portion, the semiconductor device substrate and its fabricating method, wherein the cavity portion is formed into two step sections, one for the wire bonding portion (inner connection portion) and the other for the semiconductor chip mount portion, are provided as shown in FIG. 11, for example. In a method for forming the two step cavity portion, the first step is fabricated by press forming the prepregs using a die with a projected portion, and the second cavity step by milling.

The semiconductor device may be fabricated by forming a plurality of the cavity portions on single semiconductor device substrate, adhering chips on each cavity, sealing with the resin, attaching the solder balls, and dicing to separate each device.

FIGS. 10 to 13 are cross sectional figures showing typical semiconductor devices in the present embodiment.

Numeral 1 in the figures indicates the semiconductor chip, 2 indicates the wiring, 3 indicates the wire, 4 indicates the sealant, 5 indicates the external terminal electrode, 6 indicates the surface insulation layer, 7 indicates the insulator substrate, 8 indicates the metal plate, and 9 indicates the insulation plate.

Figure 12:
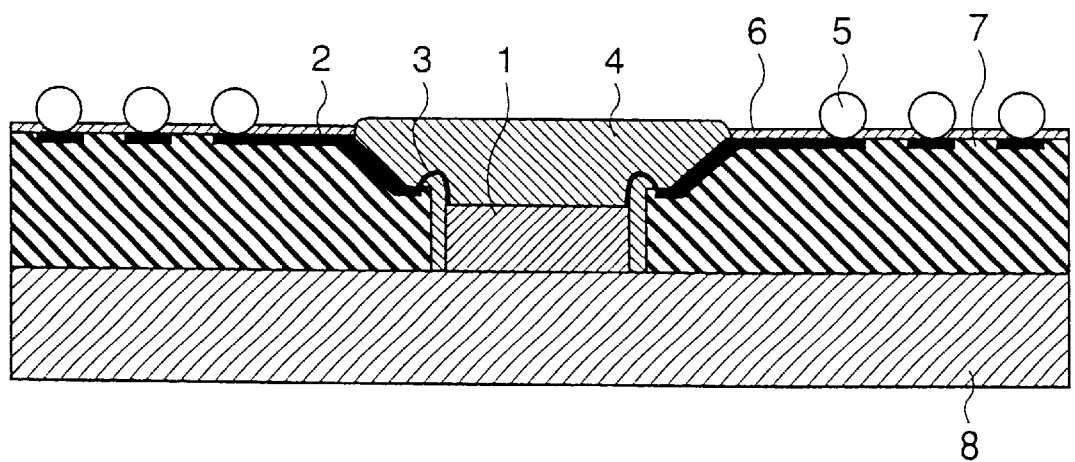
FIG. 12 is a cross sectional view showing other example of the semiconductor device according to the present invention.
Figure 13:
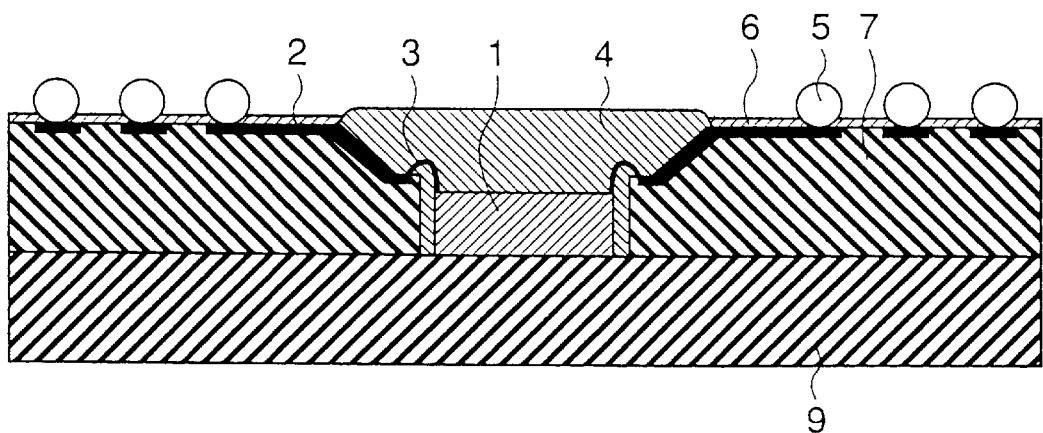
FIG. 13 is a cross sectional view showing another example of the semiconductor device according to the present invention.

A part of the cavity portion shown in FIG. 11 may comprises a through hole. As shown in FIGS. 12 and 13, the metal plate 8, the insulation plate 9 may be used as a support at the bottom side of the semiconductor device.

An example of the fabricating method of the semiconductor device in the present embodiment will now be explained with reference to FIG. 14.

A three layer structure foil, formed by plating a 0.5 $\mu$m thick nickel layer 11 over a 35 $\mu$m copper foil 10 (carrier foil fabricated by NIHON DENKAI Co.) and further forming a 5 $\mu$m copper layer, is prepared. The copper layer with 5 $\mu$m thickness is etched after forming a resist pattern with a conventional photo-resist method so as to form the wiring conductor 12.

The etching solution is required to have a selectivity for etching only copper and not nickel. Alkali etchants which are widely used in the print board industry are preferred. The carrier layer with 35 $\mu$m thickness is protected by the resist from being etched.

Figure 14:
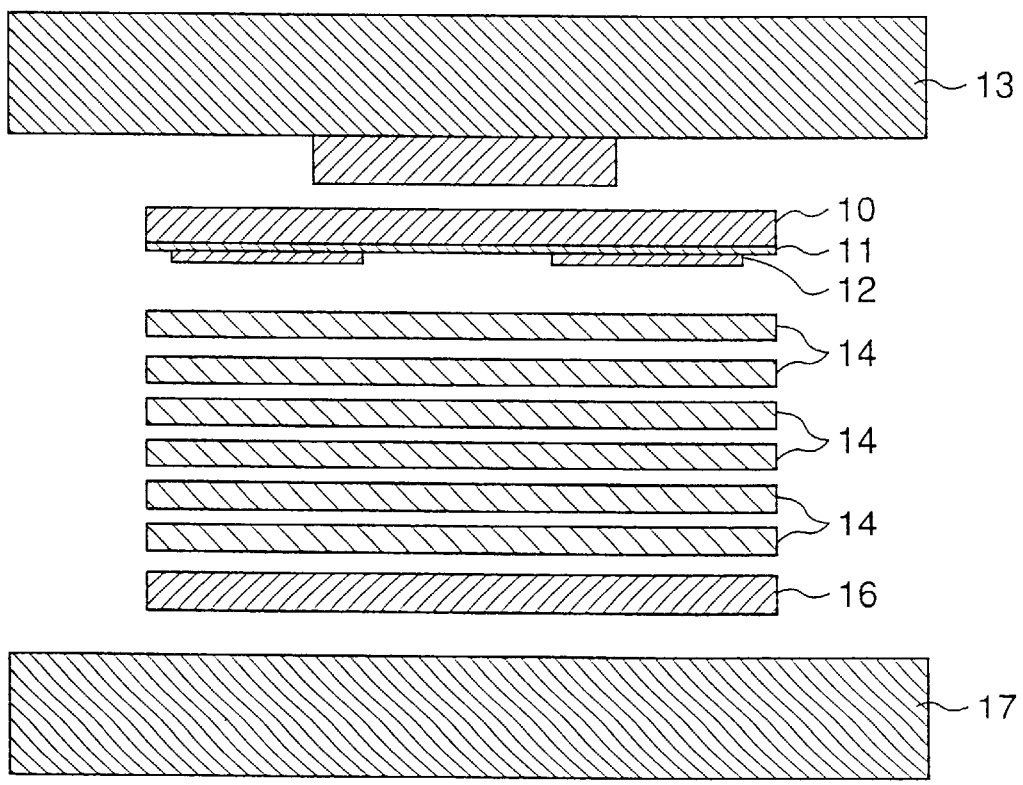
FIG. 14 is a cross sectional view showing another example of the fabricating method (press configuration) of the semiconductor device according to the present invention.

The copper foils 10 to 12 with the pattern (wiring conductor 12) are heat pressed in the arrangement shown in FIG. 14 for two hours at a temperature of 180° C. and a pressure of 25 kg/cm$^2$. A projected portion of the die 13 has a height of 0.15 mm with a slant angle of 90°. Sheets of teflon (Dupont Co.) with a thickness of 50 $\mu$m, which is not shown in the figure, are placed in between the dies 13, 17 and copper foils 10, copper plate 16 to provide cushion layers during the press shaping process.

GEA-679 (product name, Hitachi Chemical Company, Ltd.), which are fabricated by impregnating epoxy resin into glass fabric base are used as the prepregs 14.

A glass epoxy substrate fabricated by the conditions described above contains a plurality of units each comprising the same wiring and the cavity portion. The carrier copper foil of the glass epoxy substrate is etched by the alkali etchant described above to remove the carrier copper foil from the whole surface area.

Next, the nickel layer is etched away by an etching solution for selectively etching nickel. According to the above mentioned conditions, the cavity portions of 0.15 mm depth are formed in the substrate with 1 mm thickness, and the continuous wiring is disposed on the surface layer including surface planes of the cavity portions. The substrate is milled further by a milling machine up to 0.5 mm depth for mounting the semiconductor chips 1, and diced to separate each unit. The semiconductor chip 1 is adhered in the cavity portion, and connected by the wire bonding. The semiconductor chip 1 and the wire bonding portion are sealed with liquefied resin sealant to complete the semiconductor device.

Another example of the fabricating method of the semiconductor device in the present embodiment will now be explained with reference to FIG. 15.

Figure 15:
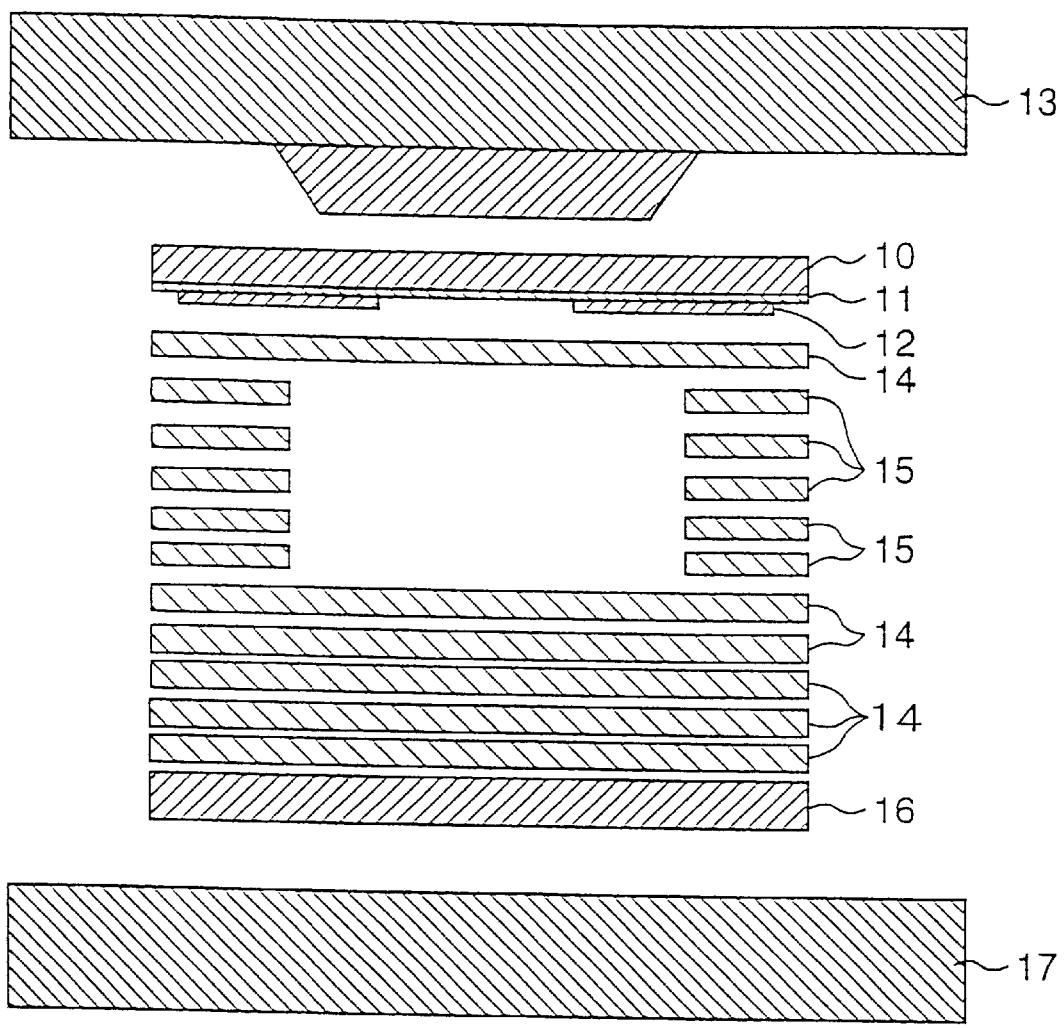
FIG. 15 is a cross sectional view showing another example of the fabricating method (press configuration) of the semiconductor device according to the present invention.

A patterned copper foil 10 with the similar construction as that of the example shown in FIG. 14 is heat pressed in the arrangement shown in FIG. 15 for two hours at a temperature of 180° C. and a pressure of 25 kg/cm$^2$. In the instant example, a projected portion of the die 13 has been fabricated to have a height of 0.5 mm with a slant angle of 45°.

Sheets of teflon (Dupont Co.) with a thickness of 50 $\mu$m, which is not shown in the figure, are placed in between the die/die 13,17 with copper foil 10 and copper plate 16 as cushion layers during the press shaping process. EA-679 (product name, Hitachi Chemical Company, Ltd.) fabricated by impregnating epoxy resin into glass fabric base are used as the repregs 14. The prepregs 15 which are the same kind as the prepreg 14 are hollowed out at positions corresponding to the projected portion of the die 13, and piled so many layers as to make the total thickness of the hollowed-out prepregs comparable to the height of the projected portion.

In the instant example, five pieces of the hollowed-out prepregs 15 with 0.1 mm thickness and five pieces of the prepregs 14 without a hole are used for the projected portion of 0.5 mm height. A glass epoxy substrate fabricated by the conditions described above contains a plurality of units each comprising the same wiring and the cavity portion. The carrier copper foil of the glass epoxy substrate is etched by the alkali etchant described above to remove the carrier copper foil 10 from the whole surface area, and then the nickel layer 11 is etched away by an etching solution which selectively etches nickel.

According to the above mentioned conditions, the cavity portions of 0.5 mm depth are formed in the substrate with 1 mm thickness, and the continuous wiring is disposed at the surface layer including surface planes of the cavity portion. The semiconductor chips 1 are adhered in the cavity portions, and connected by the wire bonding. The semiconductor chip 1 and the wire bonding portion are sealed with liquefied resin sealant. After solder balls 5 are attached, the substrate is diced and separated by each device unit to complete the fabrication of the semiconductor device.

Another example of the fabricating method of the semiconductor device in the present embodiment will now be explained with reference to FIG. 16.

Figure 16:
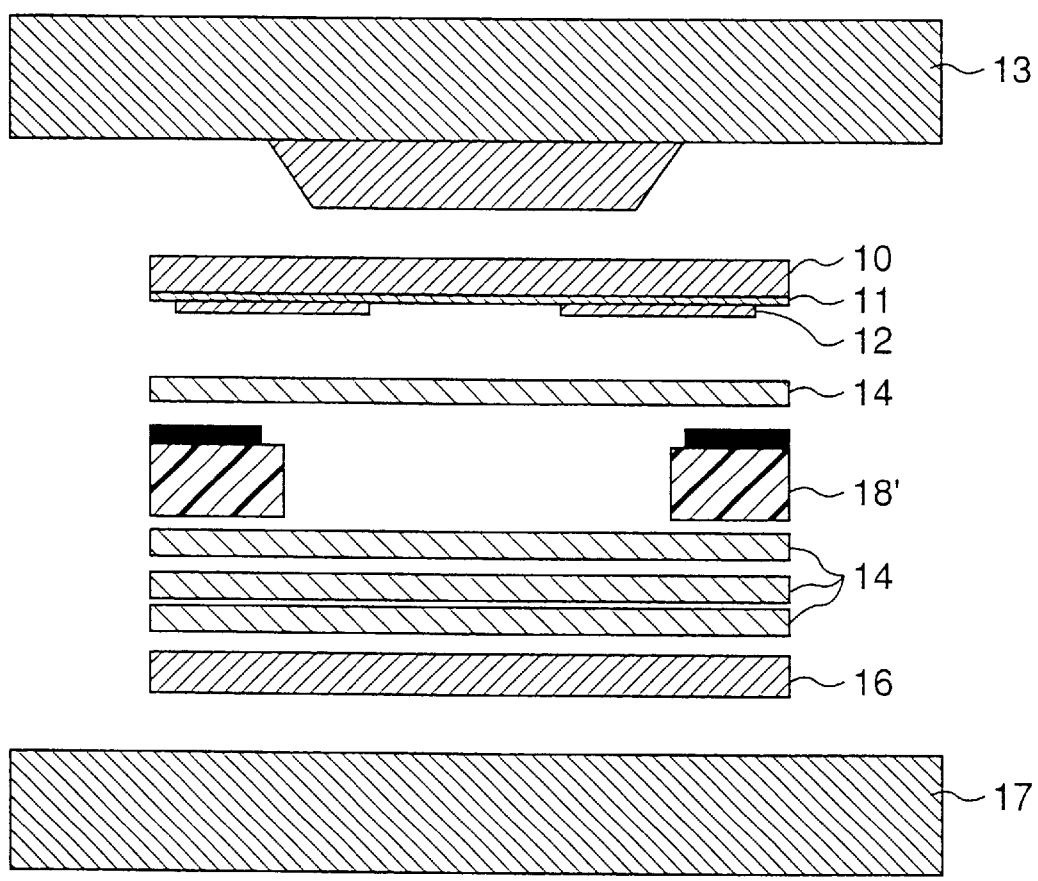
FIG. 16 is a cross sectional view showing another example of the fabricating method (press configuration) of the semiconductor device according to the present invention.

A patterned copper foil 10 with the similar construction as that of the example shown in FIG. 14 is heat pressed in the arrangement shown in FIG. 16 for two hours at a temperature of 180° C. and a pressure of 25 kg/cm². A projected portion of the die 13 has been fabricated to have a height of 0.5 mm with a slant angle of 45°. Sheets of teflon (Dupont Co.) with a thickness of 50 $\mu$m, which is not shown in the figure, are placed in between the dies 13, 17 and copper foils 10, copper plate 16 to provide cushion layers during the press shaping process. GEA-679 (product name, Hitachi Chemical Company, Ltd,) fabricated by impregnating epoxy resin into glass fabric are used as prepregs.

A glass epoxy substrate 18' with 0.5 mm thickness is hollowed out at position corresponding to the projected portion of the die 13. In the instant example, a piece of the prepreg 14 of 0.1 mm thickness without a hole is placed in between the glass epoxy substrate 18' and the patterned copper foils 10, and three pieces of the prepregs 14 are placed the lower side of the glass epoxy substrate 18'.

The glass epoxy substrate fabricated by the conditions described above contains a plurality of device units, each comprising the same wiring and the same cavity portion. The carrier copper foil of the glass epoxy substrate is etched by the alkali etchant described above to remove the carrier copper foil from the whole surface area, and then the nickel layer 11 is etched away by an etching solution for selectively etching nickel.

According to the above mentioned conditions, cavity portions of 0.5 mm depth are formed in the substrate with 1 mm thickness, and the continuous wiring is disposed at the surface layer including surface planes of the cavity portions. The semiconductor chips 1 are adhered in the cavity portions, and connected by the wire bonding. The semiconductor chip 1 and the wire bonding portion are sealed with liquefied resin sealant. After solder balls 5 are attached, the substrate is diced and separated into each units to complete the semiconductor device.

According to the present embodiment, the semiconductor device may be provided with a simple structure, and fabricated utilizing simpler fabricating process of lower cost.

Next, other embodiments of the semiconductor device, the semiconductor device substrate and the fabricating method of the present invention are now explained with reference to FIGS. 17–20.

Figure 17:
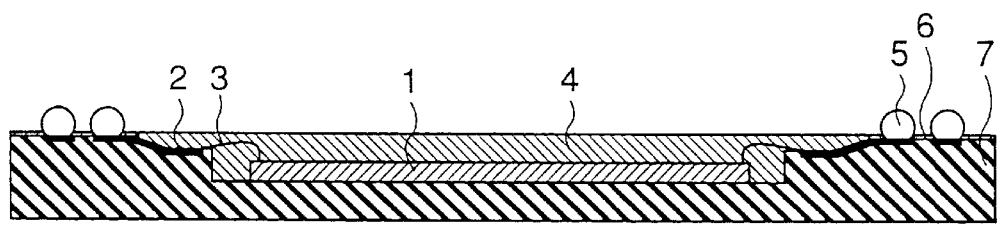
FIG. 17 is a cross sectional view showing another example of the semiconductor device according to the present invention.

As shown in FIG. 17, the semiconductor device of the present embodiment is provided with a semiconductor chip 1, an insulator substrate (a semiconductor device substrate) 7 having a semiconductor chip mount portion for mounting the semiconductor chip 1, external electrodes 5 formed at an surface of the insulator substrate 7 and electrically connected to the semiconductor chip 1 for making connections to outside when the semiconductor chip 1 was mounted, sealant 4 for sealing the semiconductor mounting portion in which the semiconductor chip 1 had been mounted. Furthermore, the semiconductor device of the present embodiment is provided with ramps between wire 3 for connecting to the semiconductor chip 1 and the external electrode 5, and wiring 2 disposed along slope portion of the ramp connecting in between. A numeral 6 in the figure indicates a surface insulation layer formed at a surface of the insulator substrate 7.

The semiconductor chip mount portion of the semiconductor device of the present embodiment is fabricated by further hollowing out a base surface of a cavity portion of the semiconductor device substrate, which is fabricated by a fabricating method which will be explained in the following section with reference to FIG. 20, for example.

A slant angle of side surfaces of the cavity portion is less than 45°. The slant angle may be determined in accordance with a slant angle of the projected portion of the die for the press forming, or a balance between a rigidity of a transfer copper foil (carrier layer) 10 and a pressure during the press forming.

Figure 18:
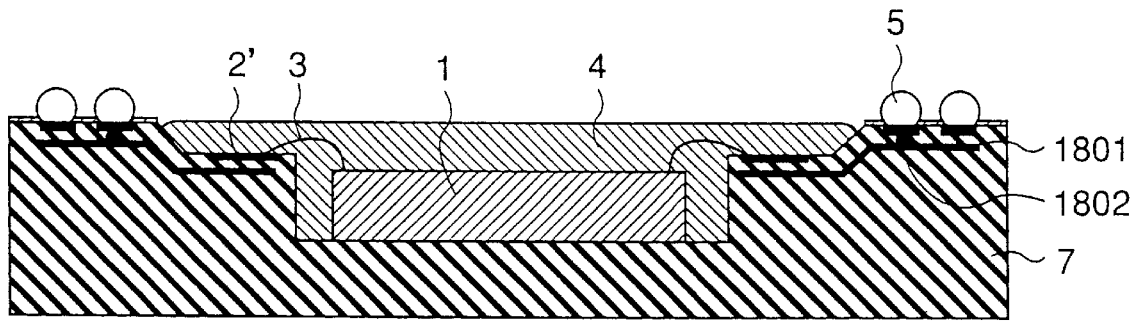
FIG. 18 is a cross sectional view showing another example of the semiconductor device according to the present invention.

The semiconductor device of the present embodiment is not limited to an example shown in FIG. 17. The semiconductor device may be provided with a multiple layer structure as shown in FIG. 18, wherein the wiring 2 is disposed in the bottom surface of the cavity portion instead of its side walls, and a ground layer 1801 is provided below the wiring 2 while having an insulation layer in between. Furthermore, the semiconductor device may be provided with interlayer connection portions 1802 for connecting the ground layer 1801 and the external electrodes 5.

In the present embodiment, a method for forming the ground layer 1801 and a method for interconnecting the layers are not limited to any particular arts. For example, the multiple layer structure of the substrate may be formed by placing a copper foil or a copper pattern which forms the ground layer 1801 at a position facing to the wiring substrate, placing insulation adhesive sheets such as prepregs in between them, piling up the prepregs further, and press forming them altogether.

An example of the fabricating method of the semiconductor device substrate in the present embodiment will now be explained with reference to FIGS. 19 and 20.

Basic structure of the fabricating method of the present embodiment is the same as that of two previous embodiments of the fabricating methods. In the following explanation, only parts of the fabricating method different from the previous embodiments will be explained, and detail explanations regarding the similar parts will be omitted.

A three layer structure foil comprising a 25 $\mu$ thick copper foil 10 (carrier layer), a copper layer 12 which will comprises the wiring layer, and a barrier layer 11 placed between the carrier layer 10 and the copper layer 12, is used as a transfer metal foil for forming the wiring 2 in the instant example of the fabricating method of the present embodiment, as the same way as in two previous embodiments. The two layers 11, 12 are shown together in the figure.

Figure 19:
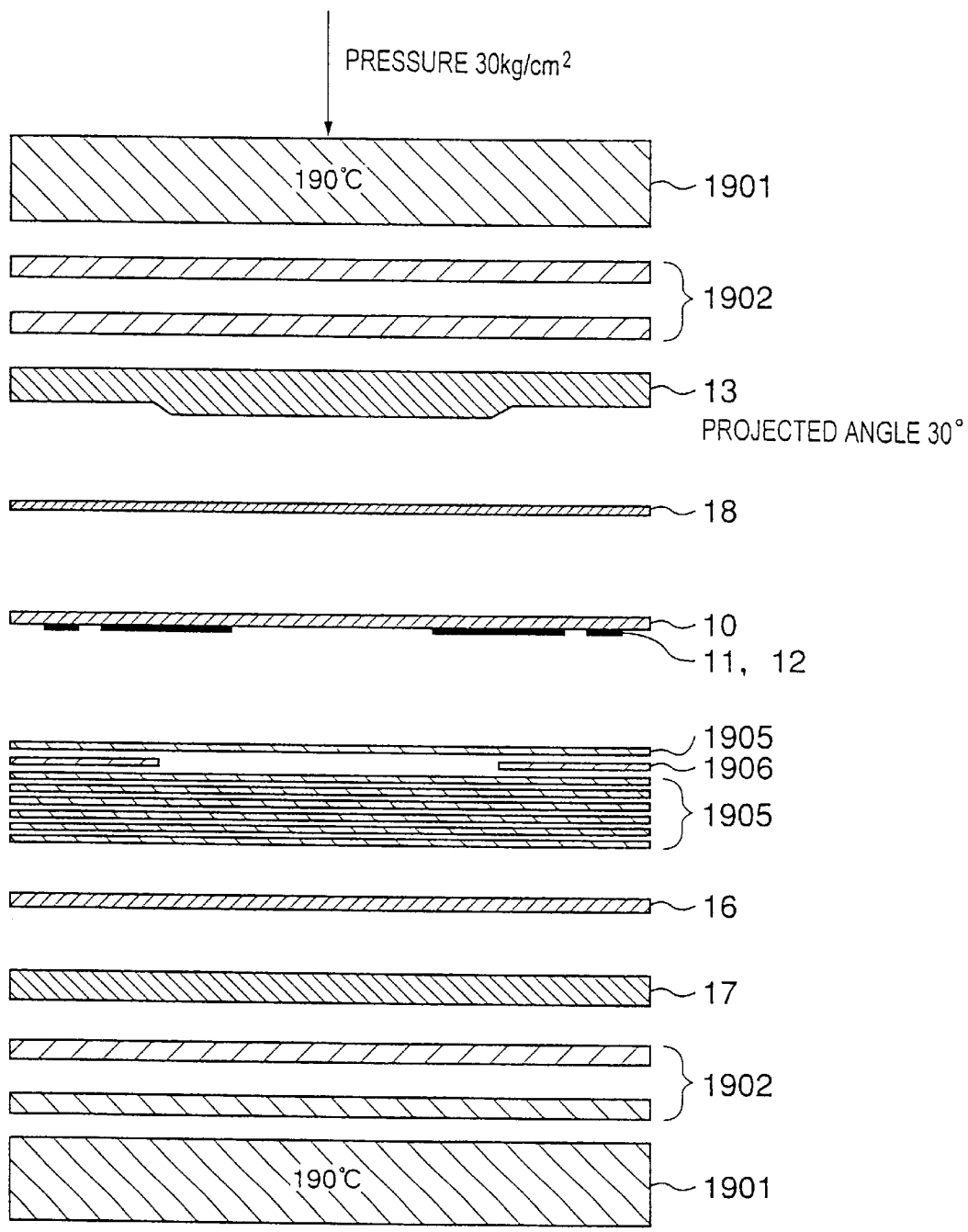
FIG. 19 is a cross sectional view showing another example of the fabricating method (press configuration) of the semiconductor device according to the present invention.

As shown in FIG. 19, the copper foil with the pattern 10–12 is heat pressed between top boards 1902 and heat boards 1901 at a temperature of 190° C. with a pressure of 30 kg/cm². A piece of aluminum foil 18, the patterned copper foil of the three layer structure 10–12, a plurality of prepregs 1905, 1906, and a copper foil 16 with a thickness of 35 μm are arrayed from top to bottom of the figure between the upper die 13 and the lower die 17.

A projected portion of the upper die 13 has a trapezoidal cross sectional shape and slant side surfaces with a slant angle of 30°. The prepreg 1906 has a through hole at a position corresponding to the projected portion of the die 13, and is placed below the first prepreg 1905.

Figure 20:
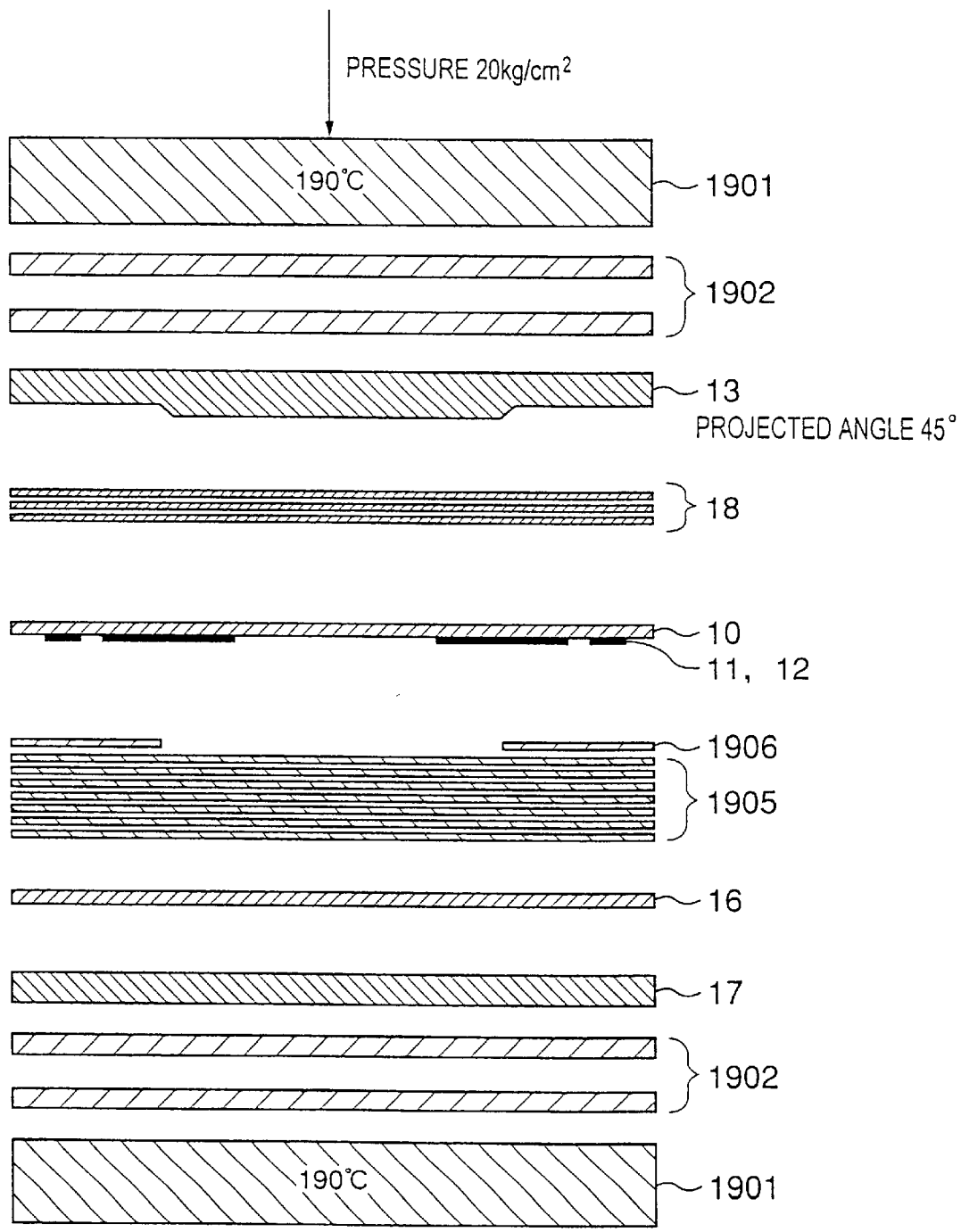
FIG. 20 is a cross sectional view showing another example of the fabricating method (press configuration) of the semiconductor device according to the present invention.

The fabricating method of the present embodiment is not limited to only the example shown in FIG. 19, but also an arrangement shown in FIG. 20 may be used.

Namely, the copper foil with the pattern 10–12 is heat pressed between top boards 1902 and heat boards 1901 at a temperature of 190° C. with a pressure of 20 kg/cm². Three pieces of aluminum foils 18, the patterned copper foil of the three layer structures 10 to 12 including the a 35 μm copper foil 10, a piece of prepreg 1906 with a through hole, a plurality of prepregs 1905, and a copper foil 16 with a thickness of 35 μm are arrayed between the upper die 13 and the lower die 17 from top to bottom of the figure, the die 13 having a projected portion with side surfaces of a slant angle of 45°.

According to the fabricating method shown in FIG. 20, the semiconductor device may be provided with the cavity portion with side walls of a lesser slant angle as shown in FIG. 17.

Another embodiment of the present invention will be described with reference to FIGS. 21–23.

Figure 21A:
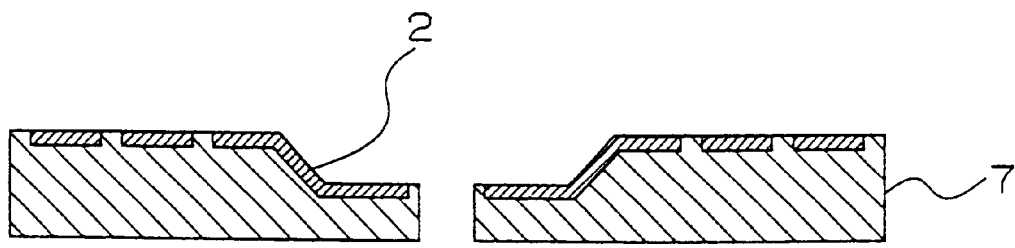
FIG. 21A is a cross sectional view showing other example of the semiconductor device substrate according to the present invention.
Figure 21B:
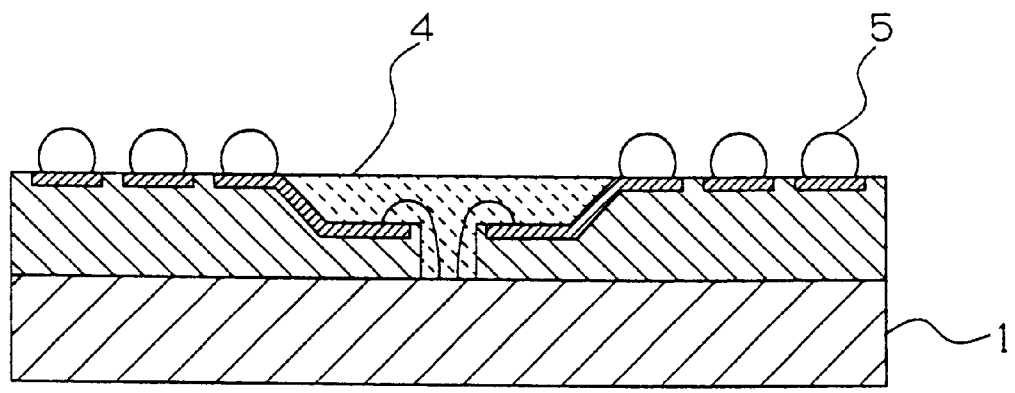
FIG. 21B is a cross sectional view showing other example of the semiconductor device according to the present invention.

The semiconductor device substrate of the present invention may be a semiconductor device substrate with a cavity portion as shown in FIG. 21A or FIG. 21B comprising wiring disposed along the top surface of the substrate and wall surfaces of the cavity portion, wherein the wiring comprises an external connection terminal portion for connecting external connection terminals formed on a surface of the substrate at an opening side of the cavity portion, an internal connection terminal portion for connecting to the mounted semiconductor chip, and a wiring portion disposed between the external connection terminal portion and the internal connection terminal portion. Furthermore, the wiring is disposed on the substrate surface and wall surfaces of the cavity portion, and the internal connection terminal portion is disposed inside of the cavity portion.

Figure 22A:
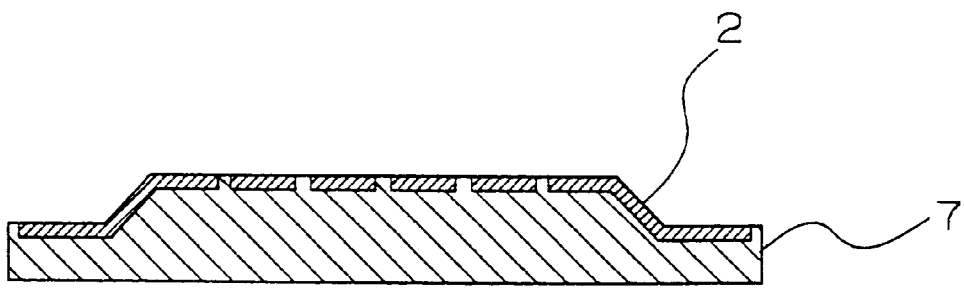
FIG. 22A is a cross sectional view showing other example of the semiconductor device substrate according to the present invention.
Figure 22B:
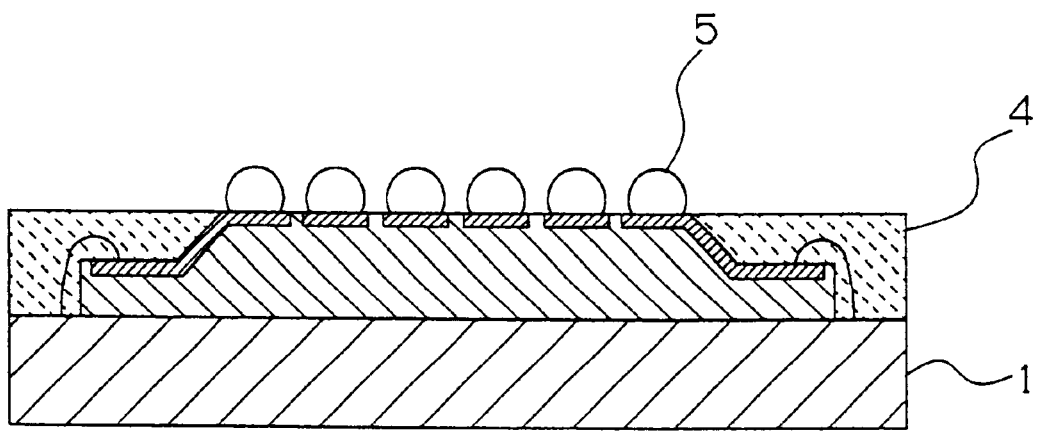
FIG. 22B is a cross sectional view showing other example of the semiconductor device according to the present invention.

In FIG. 21A, FIG. 22B, numeral 7 indicates the insulation substrate, numeral 2 indicates the wiring buried in the substrate surface and the wall surfaces of the cavity portion. A through hole at the center of the cavity portion is formed in the semiconductor device substrate of FIG. 21A. FIG. 21B shows a semiconductor device utilizing the semiconductor device substrate. In FIG. 21B, numeral 1 indicates the semiconductor chip which is adhesive-mounted on the substrate, numeral 4 indicates resin sealant, numeral 5 indicates the external connection terminals. The cavity portion of the substrate, in which the internal connection terminal portion of the wiring is formed, is sealed by the resin. The substrate may be fabricated by the fabricating method described above.

The semiconductor device substrate of FIG. 22A has cavity portions formed at both edges, which can be fabricated by forming a plurality of device units, each of which corresponds to the semiconductor device, on the substrate described above, and by dicing at the cavity portions to separate the each unit. The semiconductor device utilizing such a substrate is shown in FIG. 22B. In FIG. 22B, numeral 1 indicates the semiconductor chip which is adhesive-mounted on the substrate, numeral 4 indicates resin sealant, numeral 5 indicates the external connection terminal. The cavity portions at the both edges, in which the internal connection terminal portions of the wiring are formed, are sealed with the resin.

According to the present embodiment, the semiconductor device substrate with a plurality of the units may be fabricated by single press forming process.

Figure 23:
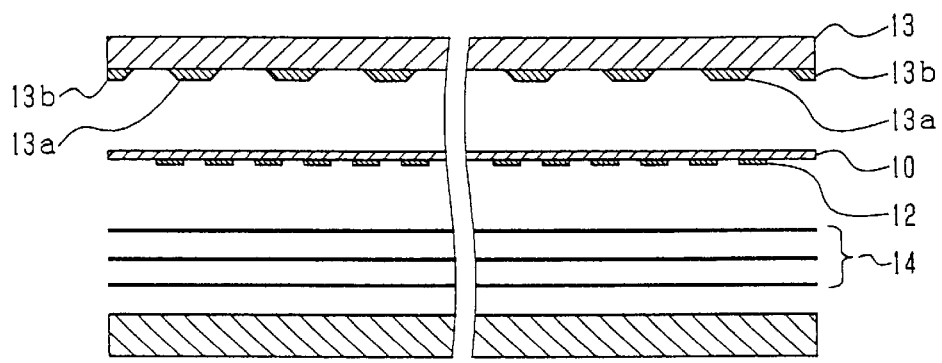
FIG. 23 is a cross sectional view showing other example of the fabricating method (press configuration) of the semiconductor device according to the present invention.

FIG. 23 shows a cross sectional view of a arrangement of the press forming for fabricating the semiconductor device substrate with a plurality of the device units. Numeral 13 indicates the die provided with a plurality of the projected portions 13a, numeral 17 indicates the lower die, numeral 10 indicates a copper foil in which a plural sets of the wiring are formed, and numeral 14 indicates prepregs.

A plurality of the cavity portions and the wiring 12, which is continuously buried into the substrate surfaces from the external connection terminal portion to the internal connection terminal portion in the cavity portion via the wall surfaces of the cavity portion, are formed by single press forming process utilizing a plurality of the projected portions 13a, which are arrayed and evenly separated from each other in longitudinal and lateral directions.

According to the instant example, the external connection terminal portion on the substrate surface may precisely keep its position on the surface plane, at where the external connection terminal portion receives equal tensile forces generated during the formation of neighboring cavity portions, during the press forming process (high dimension stability).

Namely, the formation of the multiple device units on the semiconductor device substrate of the present invention enables to form the cavity portion without causing any shifts from the designed position of the external connection terminal portion on the surface plane, which is set prior to the press forming process. An alignment process for forming the solder resist at areas other than locations, where external connection terminals of the external connection terminal portion are to be formed, becomes easier when the position of the external connection terminal portion on the substrate surface is kept the same as before the press forming process.

In the outermost area, dummy projected portions 13b may be disposed along circumference of the die 13. According to the dummy projected portion 13b, the positional shift of the external connection terminal portions disposed at the outermost area of the substrate, and flows of resin of the prepregs may be prevented. A number of the multiple device units on the substrate is preferred to be not less than 7×7.

Next, another embodiment of the present invention will be described with reference to FIG. 24.

The present invention is provided for the optimization of a structure parameter of a semiconductor device substrate including a cavity based on a size of an external connection terminal for the purpose of the reduction of the thickness and the size of a semiconductor device. A method of optimizing a structure parameter and a method of determining a depth of the hollow space according to the present invention will be explained below with reference to FIG. 24.

Figure 24:
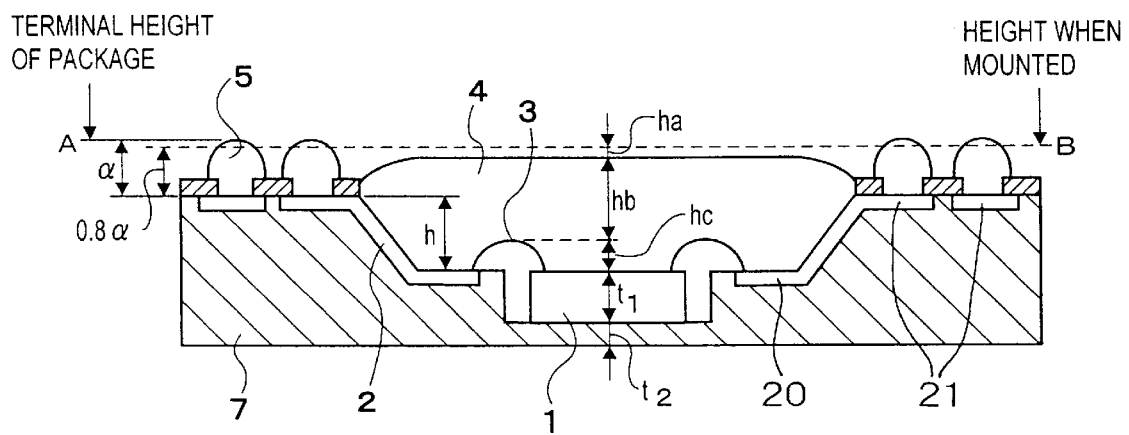
FIG. 24 is an explanatory diagram for describing a method of determining a depth of a cavity portion according to the present invention.

The semiconductor device of the present invention, as shown in its schematic structure in FIG. 24, comprises a semiconductor chip 1, an insulator substrate 7 with a cavity portion to mount the semiconductor chip 1 (semiconductor device substrate), external electrodes 5 (external connection terminals) which are disposed on a surface plane of the insulator substrate 7 to establish electrical connections to outside of the device when the device is packaged, sealant 4 for sealing the cavity portion after the semiconductor chip 1 is mounted therein, and wiring 2 for electrically connecting the semiconductor chip 1 and the external electrodes 5.

The wiring 2 comprises an inner connection terminal portion 20 connected to wire 3 for wire-bonding with a pad of the semiconductor chip 1, an external connection portion 21 connected to the external electrode 5, and a wiring portion disposed between the inner connection terminal portion 20 and the external connection terminal portion 21. The wiring 2 is buried continuously into a surface layer of the insulator substrate 7 where the external electrodes 5 are disposed, and to a surface layer of the cavity portion wall. Further, a semiconductor chip 1, wire 3, inner connection portion 20 and major parts or all parts of the wiring 2 are disposed inside the cavity portion and sealed by the sealant 4.

In the example shown in FIG. 24, hollow-out processing is performed on the cavity portion so that a space where the semiconductor chip 1 is mounted can be formed. Thus, the cavity base surface where the inner connection portion 20 is positioned and which are not hollowed out is on the same level with the surface of the semiconductor chip 1. Of course, the present invention is not limited to a semiconductor device and/or a semiconductor device substrate having the structure as shown in FIG. 24. Yet, it can be applied in the same manner to a semiconductor device and a semiconductor device substrate according to the other embodiments described above.

In the semiconductor device according to the present invention, a depth h of the cavity portion is determined based on a height a of the external electrode 5. In this case, the height $\alpha$ of the external electrode 5 is a height before being mounted on a mother board and is around 0.05 to 0.3 mm, for example. A depth h of the cavity portion is a vertical distance from a surface of the insulator substrate 7 to a cavity portion base surface where the inner connection portion is provided.

When a semiconductor device according to the present invention is mounted on a mother board, for example, a space between the surface of the insulator substrate 7 and the mother substrate is determined based on the height of the external electrode 5 and is not less than $0.7\alpha$ and not more than $\alpha$. For example, when a solder ball is used for the external electrode 5, the depth of the cavity portion is determined based on a diameter of the solder ball which corresponds to the height of the external electrode 5.

On the other hand, a thickness of the semiconductor device itself excluding the external electrode 5 determined at a point where the sealant 4 is formed. The thickness of the point is a sum of a thickness t2 of the insulator substrate 7 in the hollowed-out portion, a thickness t1 of the semiconductor chip 1, a distance hc from the surface of the semiconductor chip 1 to a maximum height position of the wire 3 and a thickness hb from the maximum height position of the wire 3 to the surface of the sealant 4. For example, the distance hc from the surface of the semiconductor chip 1 to the maximum height position of the wire 3 is around 0.05 mm, and the thickness hb of the sealant 4 formed above the maximum height position is around 1 to 0.15 mm. In reality, a space ha is needed with respect to the mother substrate and it is around 0.1 mm.

Accordingly, in order to reduce the thickness of the structure of the semiconductor device according to the present invention based on the height of the external electrode 5, a distance from the surface of the semiconductor chip 1 to the mother board, which determines the thickness of the semiconductor device of the present invention, needs to be smaller than a sum of the height $0.8\alpha$ (mm) of the mounted external electrode 5 and the depth h (mm) of the cavity portion. That is, the depth h of the cavity portion is determined so as to satisfy an equation below:

$$h \geq (ha+hb+hc)-0.8\alpha \qquad (EQ1);$$

or $$h \geq 0.3-0.8\alpha \qquad (EQ2)$$

According to the present invention, the thickness of the semiconductor device can be reduced to a minimum size based on the height of the external electrode 5.

Further, since a smaller external electrode 5 can be used in the semiconductor device according to the present invention, a semiconductor device and a semiconductor device substrate can be provided, which allow the reduction of the pitch of the external electrode 5 and, as a result, allow the maximum reductions of the thickness and the sizes of the semiconductor device and the semiconductor device substrate.

According to the present invention, the semiconductor device may be fabricated by the steps comprising; a step for preparing the press forming assembly including the upper die with a plurality of the projected portions arrayed evenly in longitudinal and lateral directions, the wiring construction body comprising wiring positioned in correspondence to the projected portions and the carrier metal foil, prepregs, and the lower die; a step for pressing the assembly in between the upper and the lower dies to form a plurality of cavity portions on the substrate consisting of the pressed prepregs, and to bury the wiring into a surface of the substrate and wall surfaces of the substrate in the cavity portion in single process; a step for removing the carrier metal foil; a step for mounting the semiconductor chip; a step for sealing the cavity portions with resin; a step for forming the external connection terminals; and a step for dicing and separating into each device unit.

Further, according to the present invention, a semiconductor device, a semiconductor device substrate and a method for fabricating them can be provided which allow reduction of their thickness and size in accordance with reduction of size of an external connection terminal.

Further, according to the present invention, there can be provided a semiconductor device and a semiconductor device substrate including a cavity portion with a structure determined based on a size of the external connection terminal to be used.

What is claimed is:

1. A fabricating method of a semiconductor device substrate having a cavity portion for mounting a semiconductor, comprising the steps of:

pressing to adhere a squeeze shapeable wiring construction body to a resin substrate, said wiring construction body having a multiple layer structure comprising at least the first metal layer which is used as a wiring portion and the second metal layer which functions as a carrier layer, while forming a cavity portion on said resin substrate; and removing the metal layers except the first layer, wherein:
said wiring, which is buried in said resin substrate surface and wall surface of said cavity portion, is formed and disposed along said resin substrate surface and said wall surface of said cavity portion;
said wiring comprising an external connection portion for connecting to external connection terminals disposed on a surface of said resin substrate on a side of said cavity opening, an inner connection portion for connecting to a semiconductor chip to be mounted, and a wiring between said external connection portion and said inner connection portion; and
a depth of said cavity portion is determined based on a height of said external connection terminal.

2. A fabricating method of a semiconductor device fabricated by forming at least one cavity portion on a semiconductor device substrate, mounting at least one semiconductor chip in said cavity portion, and sealing with sealant, said semiconductor device substrate comprising the steps of:

pressing to adhere a squeeze shapeable wiring construction body to a resin substrate, said wiring construction body having a multiple layer structure comprising at least the first metal layer which is used as a wiring portion and the second metal layer which functions as a carrier layer, while forming a cavity portion said resin substrate; and removing the metal layers except the first layer, wherein:
said wiring, which is buried in the resin substrate surface and wall surface of said cavity portion, is formed and disposed along said resin substrate surface and said wall surface of said cavity portion;
said wiring comprising an external connection portion for connecting to external connection terminals disposed on a surface of said resin substrate on a side of said cavity opening, an inner connection portion for connecting to a semiconductor chip to be mounted, and a wiring between said external connection portion and said inner connection portion; and
a depth of said cavity portion is determined based on a height of said external connection terminal.

3. A fabricating method of a semiconductor device in accordance with claim 2, further comprising the steps of:
attaching a metal layer to said semiconductor device substrate for heat dissipation.

* * * * *